(12) United States Patent
Emami-Neyestanak et al.

(10) Patent No.: US 9,215,114 B2
(45) Date of Patent: Dec. 15, 2015

(54) DOUBLE-SAMPLING RECEIVER WITH DYNAMIC OFFSET MODULATION FOR OPTICAL AND ELECTRICAL SIGNALING

(71) Applicant: California Institute of Technology, Pasadena, CA (US)

(72) Inventors: Azita Emami-Neyestanak, Pasadena, CA (US); Meisam Honarvar Nazari, Pasadena, CA (US); Saman Saeedi, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 246 days.

(21) Appl. No.: 13/888,334

(22) Filed: May 6, 2013

(65) Prior Publication Data
US 2013/0294546 A1    Nov. 7, 2013

Related U.S. Application Data

(60) Provisional application No. 61/643,086, filed on May 4, 2012.

(51) Int. Cl.
*H04L 25/06* (2006.01)
*H03F 1/08* (2006.01)

(52) U.S. Cl.
CPC ............... *H04L 25/061* (2013.01); *H03F 1/08* (2013.01)

(58) Field of Classification Search
CPC .................................. H04L 25/061; H03F 1/08
See application file for complete search history.

(56) References Cited

U.S. PATENT DOCUMENTS

| 6,753,912 | B1 * | 6/2004 | Wayne | 348/241 |
| 2005/0168601 | A1 | 8/2005 | Lim | |
| 2008/0088368 | A1 * | 4/2008 | Rohilla | 330/9 |
| 2009/0108929 | A1 * | 4/2009 | Yan | 330/9 |
| 2011/0065410 | A1 | 3/2011 | Huang et al. | |
| 2011/0096825 | A1 | 4/2011 | Hollis | |

FOREIGN PATENT DOCUMENTS

WO    2009048773    4/2009

OTHER PUBLICATIONS

PCT International Search Report and Written Opinion dated Aug. 27, 2013 for PCT Application No. PCT/US2013/039785.
Nazari, Meisam Honarvar, et al., "An 18.6Gb/s Double-Sampling Receiver in 65nm CMOS for Ultra-Low-Power Optical Communication", Digest of Technical Papers, ISCC 2012/Session 7/Multi-Gb/s Receiver & Parallel I/O Techniques/7.1, Feb. 12, 2012, pp. 130-131.

(Continued)

Primary Examiner — Leon Flores
(74) Attorney, Agent, or Firm — Gates & Cooper LLP

(57) ABSTRACT

A receiver architecture is disclosed which employs an RC double-sampling front-end and dynamic offset modulation technique. A low-voltage double-sampling technique provides high power efficiency by avoiding linear high-gain elements conventionally employed in typical transimpedance-amplifier (TIA) receivers. In addition, a demultiplexed output of the receiver helps save power in the subsequent digital blocks. Various applications are described including optical receivers, electrical on-chip interconnects, as well as pulse amplitude modulation. The receiver can be implemented in CMOS and is scalable and portable to other technologies.

24 Claims, 38 Drawing Sheets

(56) References Cited

OTHER PUBLICATIONS

Sugita, H., et al., "A 16Gb/s 1st-Tap FFE and 3-Tap DFE in 90nm CMOS," IEEE ISSCC Dig. Tech. Papers, pp. 162-163, Feb. 2010.
Liu, Y., et al, "A 10Gb/s Compact Low-Power Serial I/O with DFE-IIR Equalization in 65nm CMOS," IEEE ISSCC Dig. Tech. Papers, pp. 182-183, Feb. 2009.
Nazari, M. H., et al., "A 15Gb/s 0.5mW/Gb/s 2-Tap DFE Receiver with Far-End Crosstalk Cancellation," IEEE ISSCC Dig. Tech. Papers, pp., Feb. 2011.
Schow, C. L., et al., "Low-Power 16x10 Gb/s Bi-Directional Single Chip CMOS Optical Transceivers Operating at < 5 mW/Gb/s/link," IEEE Journal of Solid-State Circuits, vol. 44, No. 1, pp. 301-313, Jan. 2009.
Kromer, C., et al., "A 100-mW 4x10 Gb/s Transceiver in 80-nm CMOS for High-Density Optical Interconnects," IEEE Journal of Solid-State Circuits, vol. 40, No. 12, pp. 2667-2679, Dec. 2005.
Takemoto T., et al., "A Compact 4x25-Gb/s 3.0 mW/Gb/s CMOS-Based Optical Receiver for Board-to-Board Interconnects," IEEE J. of Lightwave Tech., vol. 28, No. 23, pp. 3343-3350, Dec. 2010.
Young, I. A., et al., "Optical I/O Technology for Tera-Scale Computing," IEEE Journal of Solid-State Circuits, vol. 45, No. 1, pp. 235-248, Jan. 2010.
Liu, F., et al., "10Gbps, 530fJ/b optical transceiver circuits in 40nm CMOS," IEEE Symp. on VLSI circuits Dig. Tech. Papers, pp. 290-291, Jun. 2011.
Palermo, S., et al., "A 90 nm CMOS 16 Gb/s Transceiver for Optical Interconnect," IEEE Journal of Solid-State Circuits, vol. 43, No. 5, pp. 1235-1246, May 2008.
Kucharski, D., et al., "10Gb/s 15mW Optical Receiver with Integrated Germanium Photodetector and Hybrid Inductor Peaking in 0.13μm SOI CMOS Technology," IEEE ISSCC Dig. Tech. Papers, pp. 360-361, Feb. 2010.
Narasimha, A., et al., "A Fully Integrated 4x10-Gb/s DWDM Optoelectronic Transceiver Implemented in a Standard 0.13 μm CMOS SOI Technology," IEEE JSSC, vol. 42, No. 12, pp. 2736-2744, Dec. 2007.
Montanaro, J., et al., "A 160-MHz, 32-b, 0.5-W CMOS RISC microprocessor," IEEE Journal of Solid-State Circuits, vol. 31, No. 11, pp. 1703-1714, Nov. 1996.
Lee, M. E., et al., "Low-Power Area-Efficient High-Speed I/O Circuit Techniques," IEEE Journal of Solid-State Circuits, vol. 35, No. 11, Nov. 2000.
Emami-Neyestanak, A., et al., "A 1.6Gb/s, 3mW CMOS receiver for optical communication," in IEEE Symp. VLSI Circuits Dig., pp. 84-87, Jun. 2002.
Pelgrom, M. J. M., et al., "Matching properties of MOS transistors," IEEE Journal of Solid-State Circuits, vol. 24, No. 5, pp. 1433-1439, Oct. 1989.
Sidiropoulos, S., et al., "A Semidigital Dual Delay-Locked Loop," IEEE Journal of Solid-State Circuits, vol. 32, No. 11, pp. 1683-1692, Nov. 1997.
Alexander, J. D. H., "Clock recovery from random binary signals," IEEE Electronics Letters, vol. 11, pp. 541-542, 1975.
Emami-Neyestanak, A., et al., "CMOS transceiver with baud-rate clock recovery for optical interconnects," in IEEE Symp. VLSI Circuits Dig., pp. 410-413, Jun. 2004.
Nazari, M. H., et al., "Ultra Low-Power Receiver Design for Dense Optical Interconnects," IEEE Optical Interconnects Conf., May 2012.
Georgas, M., et al., "A Monolithically-Integrated Optical Receiver in Standard 45-nm SOI," IEEE Journal of Solid-State Circuits, vol. 47, No. 7, pp. 1693-1702, Jul. 2012.
Ito, H., et al., "A Low-Latency and High-Power-Efficient On-Chip LVDS Transmission Line Interconnect for an RC Interconnect Alternative,"IEEE Int. Interconnect Tech. Conf., pp. 193-195, 2007.
Seo, J., et al., "High-Bandwidth and Low-Energy On-Chip Signaling with Adaptive Pre-Emphasis in 90nm CMOS," IEEE ISSCC Digest of Technical Papers, pp. 182-183, Feb. 2010.
Ho, R., et al., "High Speed and Low Energy Capacitively Driven On-Chip Wires," IEEE J. Solid-State Circuits, vol. 43, No. 1, pp. 52-60, 2008.
Walter, D., et al.,"A Source-Synchronous 90Gb/s Capacitively Driven Serial On-Chip Link Over 6mm in 65nm CMOS," IEEE ISSCC Digest of Technical Papers, pp. 180-181, Feb. 2012.
Mensink, E., et al., "Power Efficient Gigabit Communication over Capacitively Driven RC-Limited On-Chip lnterconnects, " IEEE J. Solid-State Circuits, vol. 45, No. 2, pp. 447-457, 2010.
Jose, A. P., et al., "Distributed Loss-Compensation Techniques for Energy-Efficient Low-Latency On-Chip Communication," IEEE J. Solid-State Circuits, vol. 42, No. 6, pp. 1415-1424, 2007.
Kim, B., et al., "A 4Gb/s/ch 356fJ/b 10mm Equalized On-Chip Interconnect with Nonlinear Charge-Injecting Transmit Filter and Transimpedance Receiver in 90nm CMOS," IEEE ISSCC Digest of Technical Papers, pp. 66-67, Feb. 2009.
Rhew, H. G., et al., "A 22Gb/s, 10mm On-Chip Serial Link over Lossy Transmission Line with Resistive Termination," in Proc. Eur. Solid-State Circuits Conf., pp. 233-236, 2012.
Kucharski, D., et al., "10Gb/s 15mW optical receiver with integrated Germanium photodetector and hybrid inductor peaking in 0.13 μm SOI CMOS Technology." Solid-State Circuits Conference Digest of Technical Papers (ISSCC), 2010 IEEE International. IEEE, 2010.
Li, G., et al., "Ultralow-power silicon photonic interconnect for high-performance computing systems." Optoelectronic Interconnects and Component Integration IX7607 760703 (2010): 1-7.
Liu, F., et al., "10 Gbps, 530 fJ/b optical transceiver circuits in 40 nm CMOS." VLSI Circuits (VLSIC), 2011 Symposium on. IEEE, 2011.
Georgas, M., et al., "A monolithically-integrated optical receiver in standard 45-nm SOI." Solid-State Circuits, IEEE Journal of 47.7 (2012): 1693-1702.
Nazari, M.H., et al., "24-Gb/s Double-Sampling Receiver for Ultra-Low-Power Optical Communication", IEEE Journal of Solid State Circuits, vol. 48, No. 2 Feb. 2013.
Proesel, J., et al., "Optical Receivers using DFE_IIR Equalization" Solid-State Circuits Conference Digest of Technical Papers (ISSCC), 2013 IEEE International. IEEE, 2013.
Saeedi, S., et al., "A 25Gb/s 17μW/Gb/s Optical Receiver in 28nm CMOS for Chip-to-Chip Optical Communication", IEEE Radio Frequency Integrated Circuits Symposium (RFIC), 2014.

* cited by examiner

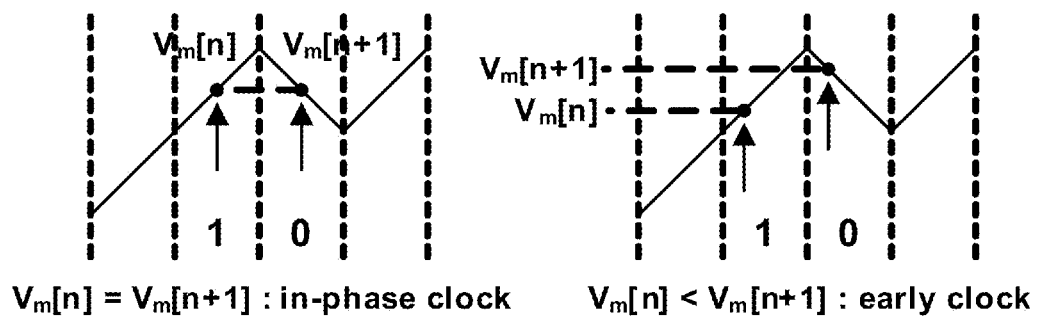
$V_m[n] = V_m[n+1]$ : in-phase clock        $V_m[n] < V_m[n+1]$ : early clock
FIG. 10A                              FIG. 10B

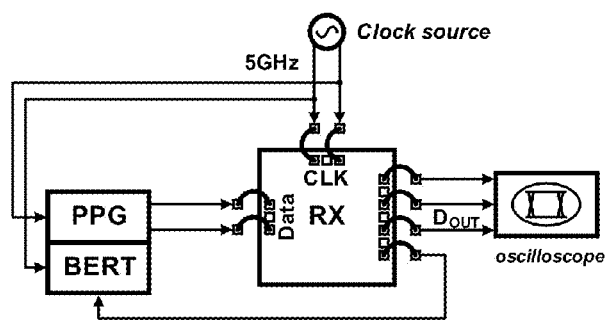
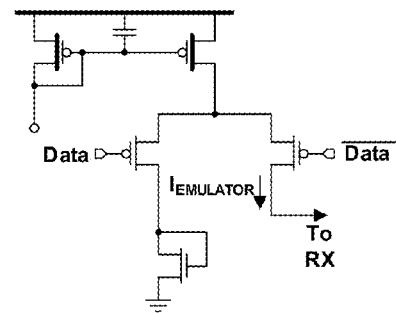
FIG. 12A
FIG. 12B

RZ Sense Amplifier output

Input Optical eye diagram @ 18.6Gb/s

DOUBLE-SAMPLING RECEIVER WITH DYNAMIC OFFSET MODULATION FOR OPTICAL AND ELECTRICAL SIGNALING

CROSS-REFERENCE TO RELATED APPLICATIONS

This application claims the benefit under 35 U.S.C. §119 (e) of the following U.S. provisional patent application, which is incorporated by reference herein:

U.S. Provisional Patent Application No. 61/643,086, filed May 4, 2012, by Azita Emami-Neyestanak and Meisam Hoarvar Nazari, entitled "Double-Sampling Receiver with Dynamic Offset Modulation for Optical and Electrical Signaling".

STATEMENT OF GOVERNMENT RIGHTS

This invention was made with government support under ECCS0747768 awarded by the National Science Foundation. The government has certain rights in the invention.

BACKGROUND OF THE INVENTION

1. Field of the Invention

This invention relates to signal receivers. Particularly, this invention relates to double sampling receivers for optical or electrical signaling.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

Integrated circuit scaling has enabled a huge growth in processing capability, which necessitates a corresponding increase in inter-chip communication bandwidth. This trend is expected to continue, requiring both an increase in the per-pin data rate and the I/O number. Unfortunately, the bandwidth of the electrical channels and the number of pins per chip do not follow the same trend. As data rates scale to meet increasing bandwidth requirements, the shortcomings of copper channels are becoming more severe. While I/O circuit performance favors from technology scaling, the bandwidth of electrical channels does not scale with the same trend. In particular, as data rate increases, they pose excessive frequency-dependent loss, which results in significant intersymbol interference (ISI) [1]-[3]. In order to continue scaling data rates, equalization techniques can be employed to compensate for the ISI. However, the power and area overhead associated with equalization make it difficult to achieve target bandwidth with a realistic power budget. As a result, rather than being technology-limited, current high-speed I/O link designs are becoming channel- and power-limited.

A promising solution to the I/O bandwidth problem is the use of optical interchip communication links. The negligible frequency-dependent loss of optical channels provides the potential for optical link designs to fully utilize increased data rates provided through CMOS technology scaling without excessive equalization complexity. Optics also allows very high information density through wavelength-division multiplexing (WDM). Hybrid integration of optical devices with electronics has been demonstrated to achieve high performance [4]-[9], and recent advances in silicon photonics have led to fully integrated optical signaling [10]-[11]. These approaches pave the way to massively parallel optical communications. In order for optical interconnects to become viable alternatives to established electrical links, they must be low-cost and have competitive energy and area-efficiency metrics. Dense arrays of optical detectors require very low-power, sensitive, and compact optical receiver circuits. Existing designs for the input receiver, such as TIA, require large power consumption to achieve high bandwidth and low noise and can occupy large area due to bandwidth enhancement inductors. Moreover, these analog circuits require extensive engineer efforts to migrate and scale to future technologies.

With the increasing bandwidth requirements of computing systems and limitations on power consumption, optical signaling for chip-to-chip interconnects has gained a lot of interest. Dense arrays of optical detectors require very low-power, sensitive, and compact optical receiver circuits. Existing designs for the input receiver, such as the transimpedance amplifier (TIA), require large power consumption to achieve high bandwidth and low noise, and can occupy a large area due to bandwidth enhancement inductors. In most optical receivers, the photodiode current is converted to a voltage signal. A simple resistor can perform the I-V conversion if the resulting RC time constant is in the order of the bit interval (Tb). However, for a given photodiode capacitance and target signal-to-noise ratio (SNR), the RC limits the bandwidth and hence the data rate. To avoid this problem, TIAs which are highly analog, power hungry are commonly employed, and do not scale well with the given technology. One alternative is to integrate the front-end to eliminate the need for resistance and break the bandwidth trade-off. However, this technique suffers from voltage headroom limitations, and requires short-length DC-balanced inputs.

In view of the foregoing, there is a need in the art for improved apparatuses and methods for optical receivers. There is particularly a need for such apparatuses and methods to operate at less than full bandwidth. Furthermore, there is a need for such apparatuses and methods to operate at very low power. These and other needs are met by embodiments of the present invention as detailed hereafter.

SUMMARY OF THE INVENTION

An optical receiver architecture is disclosed which employs an RC double-sampling front-end and dynamic offset modulation technique. The low-voltage double-sampling technique provides high power efficiency by avoiding linear high-gain elements conventionally employed in typical transimpedance-amplifier (TIA) receivers. Various applications are described, including electrical on-chip interconnects as well as pulse amplitude modulation.

An embodiment of the invention comprises an apparatus for signal receiving, comprising a front-end including a double sampling circuit for sampling the input voltage at an end of two consecutive bit times and determining a voltage difference of the sampled input voltage at the end of the two consecutive bit times, and an offset voltage or dynamic offset modulation (DOM) circuit for applying a dynamic offset voltage to the voltage difference. The voltage difference can be used to determine a signal received on the front end. The DOM circuit can avoid input-dependent performance degradation and the front-end can have a bandwidth that is at least an order of magnitude less than a bandwidth of the signal.

The front end can include a resistor or transimpedance amplifier (TIA) coupled to a capacitor at an input voltage. The bandwidth of the TIA can be a fraction of the data rate, e.g., less than 10% of the operating data rate $1/T_b$.

Typically, a binary output representing the signal is determined from the voltage difference with the applied dynamic offset. However, in other embodiments, the input voltage may be a pulse amplitude modulation signal.

In the simplest case, the TIA is a single resistor. The dynamic offset voltage gain may be $$\left(1 - e^{-\frac{T_b}{\tau}}\right),$$

where $T_b$ is a bit time $\tau$ is an RC time constant of the front end.

Typically, the input voltage is from a photodiode receiving light. In further embodiments, the input voltage may be from an on-chip interconnect. The front-end, the double sampling circuit, and the offset voltage circuit may be implemented in complementary metal oxide semiconductor (CMOS).

The front end can be for low power (less than 0.5 pJ/s) and high speed (higher than 20 Gb/s) signal communication.

The apparatus can be scalable and portable.

The double sampling circuit can perform de-multiplexing.

The signal can be a data bit sequence, wherein each bit in the sequence is indexed by an integer n and the input produces a signal in response thereto.

The front end can include a resistor-capacitor (RC) circuit that integrates the signal to produce an exponential signal, wherein a time constant RC=τ of the RC circuit is greater than a bit time T of the data bit sequence;

The double sampling circuit can sample a first level V(n−1) of the exponential signal and a next level V(n) at the bit time T later of the exponential signal, The voltage difference can be V[n]=V(n)−V(n−1), V[n]>0 can indicate the $n^{th}$ bit is a one, and V[n]<0 can indicate the $n^{th}$ bit is a zero The DOM circuit can convert V[n] into a V'[n] having a constant magnitude if the V[n] is different from the constant magnitude.

A sense amplifier or comparator can receive the V'[n] or the V[n] having the constant magnitude at its input to read each data bit in the data bit sequence; and an isolation or buffer amplifier can isolate the sense amplifier from the double sampler. The constant magnitude can be $\alpha/2(1-e^{-T/\tau})$ and $\alpha$ can be a gain between the double sampling circuit and the input of the sense amplifier.

The RC circuit can comprise a parasitic capacitance C and a resistance of the input, and a shunt resistor R in parallel with the resistance, and RC=τ can be given by the product of the resistance of R and a parasitic capacitance C, such that an output of the input in response to the data bit sequence is integrated over the parasitic capacitance to produce the exponential signal.

The signal can be a current detected by a photodiode having a parasitic capacitance, and the exponential voltage signal across the parasitic capacitance and applied to the double sampling circuit can be $V_{PD}=V_{DD}-RI_1 e^{-t/RC}$, where t is time, $I_1$ is the current generated by the input in response to a bit comprising a one, $V_{DD}$ is a voltage of a power rail of the receiver, R is selected to prevent out of range input voltages that would saturate the sense amplifier or comparator.

A method embodiment for signal receiving can comprise receiving an input voltage at a front-end including a transimpedance amplifier (TIA) coupled to a capacitor, sampling the input voltage at an end of two consecutive bit times and determining a voltage difference of the sampled input voltage at the end of the two consecutive bit times with a double sampling circuit, and applying a dynamic offset voltage to the voltage difference with an offset voltage circuit. This method embodiment of the invention may be further modified consistent with the apparatus embodiments described herein.

BRIEF DESCRIPTION OF THE DRAWINGS

Referring now to the drawings in which like reference numbers represent corresponding parts throughout:

FIG. 3 illustrates operation of the dynamic offset modulation (DOM) technique, wherein

FIGS. 10A-10B show 2×-oversampled phase detection for use with a receiver embodiment of the invention;

FIGS. 12A-12B illustrate an electrical measurement setup and a photodiode current emulator of a receiver embodiment of the invention;

DETAILED DESCRIPTION OF THE INVENTION

In the following description of the preferred embodiment, reference is made to the accompanying drawings, which form a part hereof, and in which is shown by way of illustration a specific embodiment in which the invention may be practiced. It is to be understood that other embodiments may be utilized and structural changes may be made without departing from the scope of the present invention.

Technical Description

1. Introduction

Figures 1A, 1B, 1C:
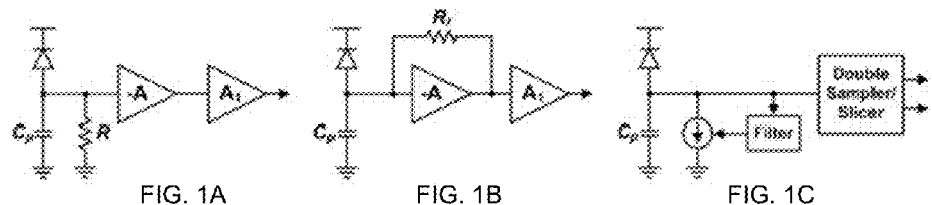
FIG. 1A shows the simplest optical front-end is a resistor receiver, wherein the resistor can convert photocurrent to a voltage that is going to be amplified by an amplifier and resolved by a data-resolution slicer block, this simple architecture is extremely power/area efficient but lacks speed, the resistor needs to be large enough to keep the transimpedance high enough so that reasonable a signal-to-noise ration (SNR) and bit error rate (BER) is achieved, a large resistance (R), in turn, creates a low-frequency pole at the input node, limiting the maximum speed of the receiver.
FIG. 1B shows a transimpedance front-end with limiting amplifiers, wherein a resistor termination of the input of FIG. 1A is replaced with a transimpedance amplifier (TIA) in order to increase the bandwidth at the input node, for a given transimpedance, TIA's tend to have lower input resistance compared to the case of resistor termination, which makes the TIA based transceivers faster at the expense of higher power consumption.
FIG. 1C shows a basic double-sampling integrating receiver, wherein in this method a DC current balances the voltage at the input node so that the voltage remains in the range of interest, the double-sampler/slicer samples the data at two points to decide whether the voltage is increasing, equivalent to a one, or the voltage is decreasing, equivalent to a zero, and while this method can achieve high data-rates, compared to previous schemes, it requires 8/10 bit encoding/decoding to make sure the DC balance is maintained and the maximum number of consecutive 1's and 0's is limited.
Figure 1D:
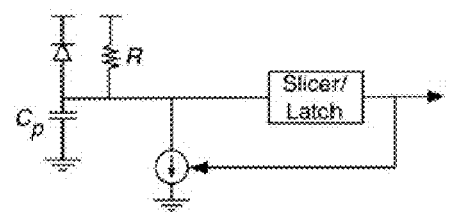
FIG. 1D shows an optical receiver using a decision feedback equalizer infinite impulse response (DFE-IIR), wherein while this method does not need a full-bandwidth input node, the DFE loop bandwidth limits the maximum speed at which the receiver can operate.

Some exemplary optical receiver front-end topologies are shown in FIGS. 1A-1D. FIGS. 1A-1C show full bandwidth approaches while FIG. 1D shows a technique to increase receiver speed for a limited input node bandwidth.

One or more embodiments of the proposed receiver resolves problems of conventional systems by employing an integrating RC front-end along with dynamic offset modulation technique that decouples the bandwidth/data-rate and integration/headroom trade-offs. In this technique, the input current from the photodiode is integrated over the parasitic capacitor, while a shunt resistor limits the voltage. This resistor along with the photodiode capacitance creates a time constant that is much larger than the bit time ($T_b$). The resulting voltage at the input is sampled every bit interval to resolve the received bit. This process is performed by comparing the two consecutive samples, however, due to the RC nature of the front-end, after several consecutive ones or zeros, the voltage reaches to the saturation level and results in close to zero voltage difference at the input of the next stage comparator. Embodiments of the present invention resolve this dependency on input by introducing a dynamic offset to the sense amplifier based on the value of the input voltage. This offset effectively increases the double-sampled voltage for weak ones/zeros.

The introduced offset is proportional to the difference between the sampled voltage and a fixed voltage with a proportionality coefficient, β. For an exponential decaying signal, β can be chosen such that the resulting double-sampled voltage is always equal to ΔVmax/2, where ΔVmax is the maximum voltage difference and occurs for a transition after many consecutive ones or zeros. As a result, a constant voltage difference can be guaranteed at the input of the comparator, regardless of the received input.

One or more embodiments of the invention can also be applied to on-chip interconnects as well. The limited bandwidth of the on-chip interconnects is mainly due to their RC nature. Especially in highly scaled technologies with highly resistive interconnects this problem is more pronounced. In addition, the ever increasing processing capability of microprocessors due to technology scaling necessitates the same trend of scaling in the I/O bandwidth. The conventional solution to the limited bandwidth of interconnects is to employ techniques such as decision feedback equalization (DFE) at the receiver or FIR pre-emphasis at the transmitter. However, the maximum achieved data rate using these techniques is less than 10 Gb/s with power efficiency of about 1 pJ/b while providing 2.5 Gb/s/μm throughput per area. The double sampling receiver with dynamic offset modulation of the present invention can achieve higher than 20 Gb/s with less than 0.2 pJ/b power efficiency and 12.5 Gb/s/μm throughput.

In addition, one or more embodiments can be further extended to more complex amplitude modulations with high spectral density such as 4-PAM in order to achieve higher data rate over bandwidth-limited channels as will be understood by those skilled in the art. For example, 4-PAM modulation achieves twice data rate as conventional OOK modulation with little extra complexity. This modulation can be employed both for the optical and electrical links 2. Optical Receiver Architecture According to One or More Embodiments The task of the optical receiver is to resolve the value of the incoming signal by sensing the changes in the magnitude of photodiode current. To minimize the transmit optical power, the receiver has to be able to resolve small optically generated current from the photodiode. In order to achieve a robust data resolution with low BER, the total input-referred noise current from the circuitry and the diode itself should be well below the optically generated current. In general, design of a low-noise front-end with a very high bandwidth is difficult and requires high electrical power consumption. In most optical receivers, the photodiode current is converted to a voltage signal.

A simple resistor, shown in FIG. 1A, can perform the I–V conversion if the resulting RC time constant is on the order of the bit interval $T_b$ [10]. A voltage amplifier then amplifies the voltage swing for the following data-resolution slicer block. Assuming that the voltage amplifier has a high bandwidth, the bit rate of such a front-end is limited by the input node time constant $RC_{in}$, where $C_{in}$ is the sum of diode capacitance and other parasitic capacitors at the input node. The time constant of the input node sets a maximum limit on the resistor R. On the other hand, the maximum possible voltage swing at this node is equal to $\Delta V=RI_{op}$ where $I_{op}$ is the input photocurrent. It is clear that lower R values degrade the signal-to-noise-ratio (SNR) at the input. This results in a strong tradeoff between the sensitivity and the bandwidth as they both depend on R. This tradeoff between sensitivity and data rate can be resolved by employing TIAs (see FIG. 1B). A TIA provides low impedance at the input node while introducing a high transconductance to convert the optical current from the photodiode into voltage. As shown in the following equation.

$$BW = \frac{1+A}{2\pi R_f C_{in}} \quad (1A)$$

the maximum bandwidth, and hence the data rate, supported by TIA is proportional to its gain A.

Figure 1E:
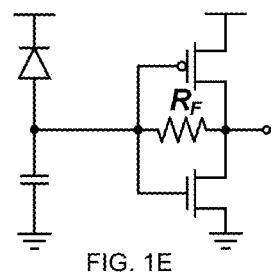
FIG. 1E shows an inverter based TIA.

As a result, to achieve a high data-rate, a TIA with large gain-bandwidth product is required, which can result in high power consumption. Passive components such as inductors can be employed to enhance the bandwidth of TIA [4]-[6], but impose a significant area overhead. FIG. 1E illustrates one example employing an inverter as the gain stage in the TIA. The resulting input resistance, $R_{in}$, and transimpedance, $R_t$, can be expressed as $$R_{in} = \frac{R_F + r_{ds}}{1 + g_m r_{ds}}$$

$$R_t = \frac{g_m R_F - 1}{1 + g_m r_{ds}} r_{ds}$$

Figure 1F:
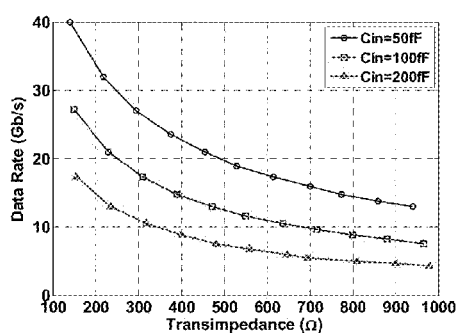
FIGS. 1F and 1G show TIA data rate and power consumption vs. transimpedance, respectively, for different photodiode capacitances.
Figure 1G:
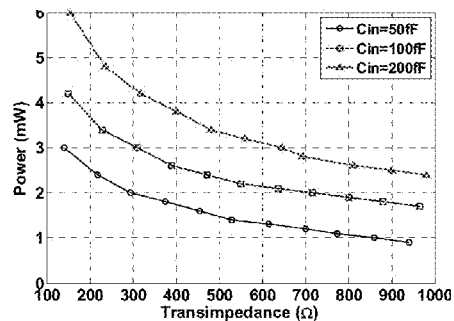

FIG. 1F shows how data rate changes with $R_t$ for different photodiode parasitic capacitance in 65 nm CMOS process. It can be seen that for $C_{in}=200$ fF it is not possible to achieve 20 Gb/s operation. FIG. 1G shows the power consumption of this design. It should be noted that to achieve high sensitivity larger transimpedance is required. As a result, additional gain stages are required to enable high sensitivity, which adds to the overall power consumption. To achieve high data rates, TIA architectures such as [6] can be employed, however the additional power and area is significant.

An alternative to TIA is the integrating front-end [15] as shown in FIG. 1C. The input signal from the photodetector is a single-ended, positive current. The injected charge is higher if the bit value is "1," but it is not necessarily zero when the bit value is "0." Therefore, in order to have a bipolar voltage change at the input of receiver a constant charge is subtracted from the input capacitor for every bit. This can be done by subtracting an adjustable current from the input through a feedback loop. By sampling the input voltage at the end of each bit period the received bit is resolved.

The double-sampling technique allows for immediate demultiplexing at the front-end by employing multiple clock phases and samplers. It also eliminates the need for high gain stages, such as TIA, that operate at the input data rate. Another advantage associated with this technique is the inherent single ended to differential conversion that happens at the front-end and reduces receiver sensitivity to common-mode interferences. A significant advantage of this technique is that it mainly employs digital circuitry that allows for achieving considerable power saving by scaling to advance technology nodes. However, this technique suffers from voltage headroom limitations and requires short-length dc-balanced inputs such as 8B/10B encoded data.

Figure 2:
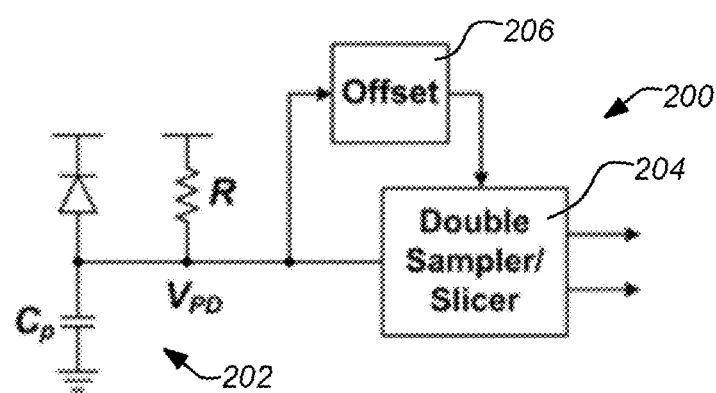
FIG. 2 is a schematic diagram of an exemplary double-sampling optical receiver embodiment of the invention.
Figure 3A:
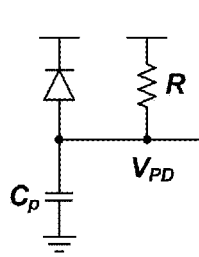
FIG. 3A illustrates a proposed RC double sampling front end architecture.
Figure 3B:
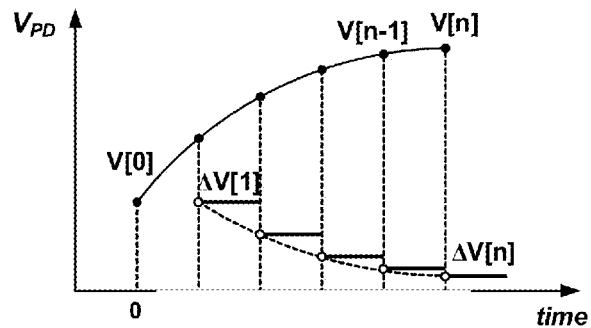
FIG. 3B shows exponential input voltage and the corresponding double sampled voltage for a long sequence of successive "1"
Figure 3C:
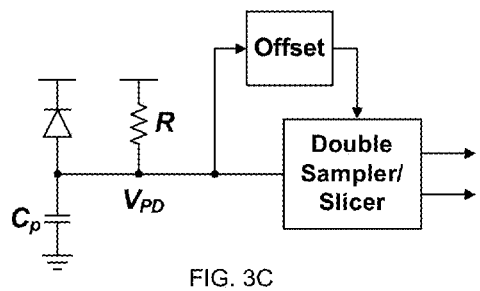
FIG. 3C is a modified front end with DOM to resolve input dependent double sampled voltage, according to one or more embodiments.
Figure 3D:
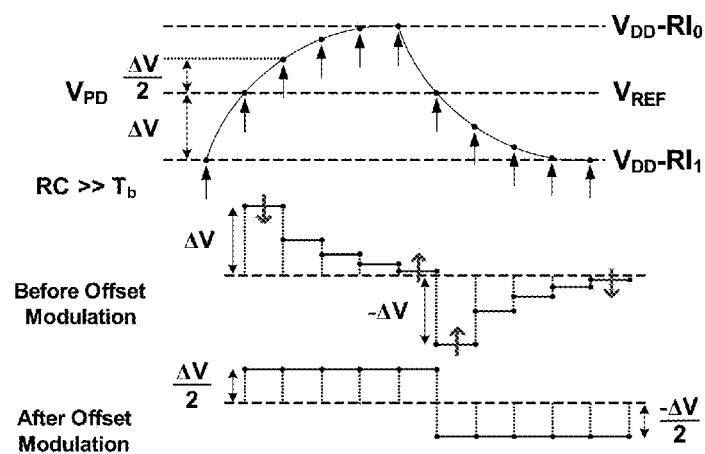
FIG. 3D shows operation of the DOM technique according to one or more embodiments.

FIG. 2 and FIG. 3C show is a schematic diagram of an exemplary double-sampling optical receiver 200 according to one or more embodiments of the invention, applying dynamic offset modulation (DOM). Accordingly, embodiments of the present invention employ an RC front-end 202 that applies a double sampling technique in order to break the trade-off between data rate and sensitivity without the described headroom problem. This technique allows for an input time constant that is much larger than $T_b$ ($RC_{in} \gg T_b$) as opposed to TIA, in which the input time constant should be smaller than the bit time. The additional resistor in the front-end automatically limits the input voltage and prevents out of range input voltages due to long sequences of "1" or "0." The input voltage can be expressed as follows $$V_{PD} = V_{DD} - RI_1 e^{\frac{-t}{RC_{in}}} \quad (2)$$

for a long sequence of "0" following a long sequence of "1," where $V_{PD}$ denotes the input voltage, R is the front-end resistance, $C_{in}$ is the total capacitance at the input, and $I_1$ is the current due to a "1" input. Double-sampling can be applied with a double-sampling circuit 204 to sample the input voltage at the end of two consecutive bit times $V_{n-1}$ and $V_n$, as shown in FIG. 3B, and these samples are compared to resolve each bit ($\Delta V[n]=V_n-V_{n-1}>0$ results in "1" and $\Delta V[n]<0$ results in "0"). However, the resistor causes the double-sampled voltage $\Delta V[n]$ to be input-dependent as expressed in the following equations:

$$V[n] = RI_1 e^{\frac{-nT_b}{RC_{in}}} \quad (3)$$

$$\Delta V[n] = RI_1 \left(1 - e^{\frac{-T_b}{RC_{in}}}\right) e^{\frac{-(n-1)T_b}{RC_{in}}} = \Delta V[1] e^{\frac{-(n-1)T_b}{RC_{in}}} \quad (4)$$

where $T_b$ denotes the bit time. For instance, a "1" after a long sequence of "0" generates larger $\Delta V[n]$ than a "1" after a long sequence of "1." The dependency of the voltage difference on the input signal can be resolved by introducing a "dynamic offset" to the sense amplifier using the system of FIG. 2 or FIG. 3C. This offset effectively increases the voltage difference $\Delta V[n]$ for weak ones/zeros and decreases it for strong ones/zeros, as shown in FIG. 3D. This technique is referenced as dynamic offset modulation (DOM) and may be performed by an offset voltage circuit 206. The principle behind this technique is to introduce an offset to the double-sampled voltage based on the value of the voltage at the input. The front-end, double-sampling circuit and voltage offset circuit may be implemented separately or together as will be understood by those skilled in the art and described in detail hereafter.

As an example, a long sequence of ones, followed by a long sequence of zeros is considered as illustrated in FIG. 3D. The first one after the series of zeros generates a large voltage at $V_{PD}$. As the number of successive ones increases, this voltage decays exponentially due to R and $C_{in}$. If the maximum double-sampled voltage is equal to $\Delta V_{max}$, DOM introduces an offset so that the sense amplifier differential input is $\Delta V_{max}/2$, regardless of the previous bits. For instance, an offset equal to $-\Delta V_{max}/2$ is applied when $\Delta V[n]=\Delta V_{max}$, no offset is applied when $\Delta V[n]=\Delta V_{max}/2$, and an offset equal to $\Delta V_{max}/2$ is applied if $\Delta V[n]=0$.

Figure 4A:
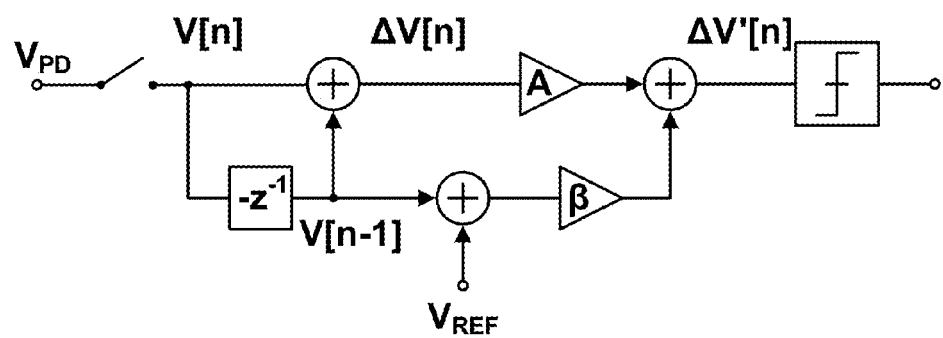
FIG. 4A is a block diagram illustrating the offset modulation technique where the first sample is subtracted from the double-sampled voltage ΔV[n] to make it constant regardless of the input sequence.

FIG. 4A shows a simple model of the double sampler where $\Delta V[n]$ can be expressed in the z-domain as $$\Delta V(z) = (1-z^{-1})V(z). \quad (5)$$

After subtracting the previous sample, V[n−1], the resulting voltage difference $\Delta V'[n]$ can be written in the z-domain as $$\Delta V'(z) = (1-z^{-1})V(z) + \beta z^{-1} V(z) \quad (6)$$

where $\beta$ is the DOM coefficient and V(z) is equal to $$V(z) = \frac{RI_1}{1 - e^{\frac{-T_b}{RC_{in}}} z^{-1}}. \quad (7)$$

In order to have a constant $\Delta V'[n]$ regardless of the received input sequence, $\beta$ is found for which $\Delta V'(z)$ is independent of z. By substituting (7) in (6), it can be shown that for $$\beta = 1 - e^{\frac{-T_b}{RC_{in}}} \quad (8)$$

Figure 4B:
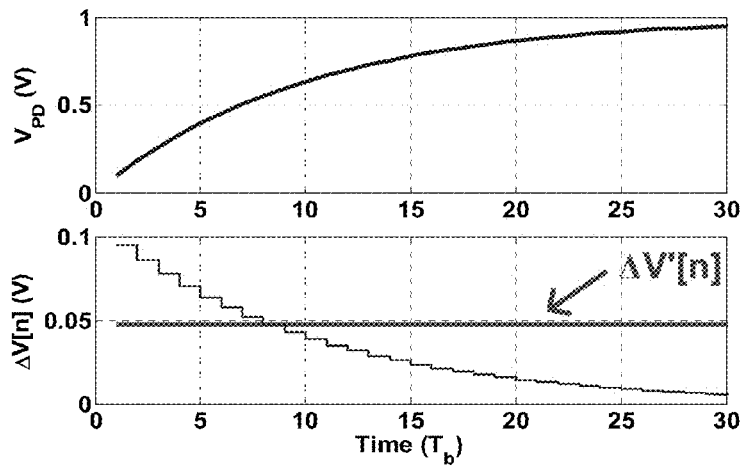
FIG. 4B shows simulated operation of the DOM for a long sequence of "1" showing ΔV[n] before and after DOM according to FIG. 4A.

$\Delta V'(z)$ will be independent of z and equal to $$\Delta V'[n] = \frac{1}{2} \Delta V_{max} \; \forall \, n \quad (9)$$

where $$\Delta V_{max} = RI_1 \left(1 - e^{\frac{-T_b}{RC_{in}}}\right). \quad (10)$$

is the double-sampled voltage due to a one (zero) following a long sequence of zeros (ones). FIG. 4B shows the simulation results showing the double-sampled voltage before and after DOM. The target value of $\beta$ can be determined using adaptive algorithms as described hereafter.

3. Analysis of an Exemplary Optical Receiver Embodiment

Figure 5:
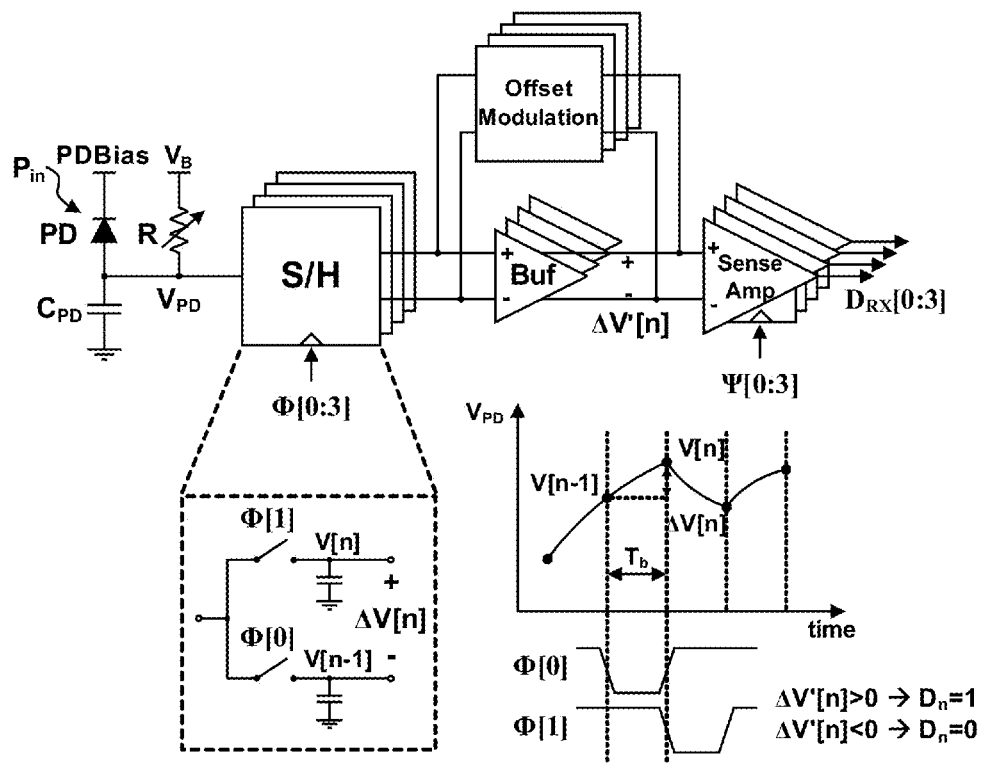
FIG. 5 shows a top-level architecture of an exemplary RC double sampling front end for an receiver embodiment of the invention.

FIG. 5 shows top-level architecture of an exemplary receiver embodiment of the invention. The input current from the photodiode is integrated over the parasitic capacitor, while the shunt resistor (R) limits the voltage. R can be designed to be adjustable to prevent saturation at high optical powers, allowing for a wide range of input optical power. As mentioned earlier, the employed double-sampling technique allows demultiplexing by use of multiple clock phases and samplers.

In this example design, a demultiplexing factor of four is chosen as the minimum possible demux factor to allow for proper operation of the double sampler and the following comparator stage. The front-end S/H is comprised of a PMOS switch and the parasitic capacitor ($C_s$) from the following stage. The optimum size of $C_s$ is chosen considering the noise performance of the front-end and S/H speed as will be explained later. An amplifier with about 6 dB of gain may be inserted between the S/H and the comparator to provide isolation between the sensitive sampling node and the comparator and minimize kickback noise. This also creates a constant common-mode voltage at the comparator input and improves its speed and offset performance. A StrongARM sense amplifier may be employed to achieve high sampling rate and low power.

Figure 6:
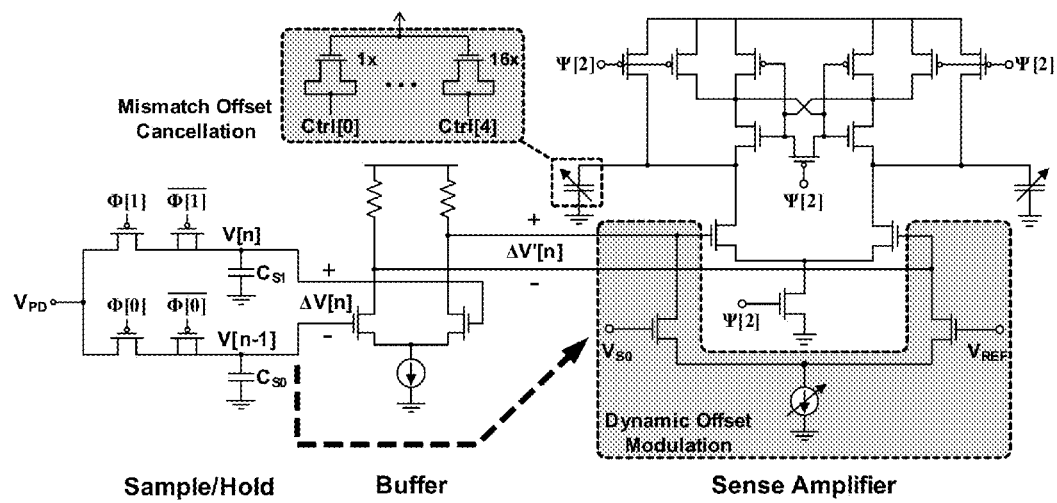
FIG. 6 shows the transistor-level schematic of the RC double-sampling front-end, according to one or more embodiments.

FIG. 6 shows a transistor-level schematic of an exemplary RC double-sampling front-end and sense amplifier. Banks of digitally adjustable NMOS capacitors are employed to compensate the offset due to mismatch. DOM is implemented using a differential pair at the input of the sense amplifier. This differential pair along with the resistors of the buffer stage form an amplifier with variable gain β, which is adjusted through the variable tail current source. As the bandwidth of this amplifier and the buffer stage are equal, V[n−1] and ΔV[n] experience the same delay to reach the input of the sense amplifier. This eliminates any timing issue in the DOM operation. The dynamic offset is proportional to the difference between the sampled voltage V[n−1] and a reference voltage $V_{REF}$. $V_{REF}$ is defined as the average of the maximum $V_{DD}-R \times I_1$ and minimum $V_{DD}-R \times I_0$ voltages at $V_{PD}$. However, it should be noted that the resulting double-sampled voltage is constant regardless of the $V_{REF}$ value, as discussed in previous section. Here $V_{REF}$ only sets the DC value of the double-sampled voltage, that is, with this value for $V_{REF}$, the resulting double-sampled voltage changes around zero. As shown in the previous section, the double-sampled voltage is equal to $$\Delta V_b = \frac{1}{2} R I_1 \left(1 - e^{\frac{-T_b}{RC_{in}}}\right). \quad (11)$$

For $T_b \ll RC_{in}$ equation (11) can be approximated by $$\Delta V_b \approx \frac{I_1 T_b}{2 C_{in}} = \frac{\rho P_{avg} T_b}{2 C_{in}}. \quad (12)$$

As a result, the receiver sensitivity is a strong function of the bit period $T_b$, total input capacitance $C_{in}$, photodiode responsivity ρ, and the total input-referred noise.

$$P_{avg} = \frac{I_1}{\rho} = \frac{2 C_{in} \Delta V_b}{\rho T_b}. \quad (13)$$

The receiver input capacitance is comprised of $$C_{in} = C_{PD} + C_{pad} + C_{WB} + C_{int} + 2 C_S \quad (14)$$

where $C_{PD}$ is the photodiode capacitance, $C_{pad}$ denotes the bonding pad capacitance, $C_{WB}$ is the wirebond capacitance, $C_{int}$ is the input interconnect capacitance, and $C_S$ is the total sampling capacitance of each sampler. The required $\Delta V_b$ is set by minimum signal-to noise ratio (SNR) for target BER and the residual input-referred offset of the sense amplifier after correction $V_{offset}$. As a result, the minimum required $\Delta V_b$ is equal to $$\Delta V_b = SNR \times \sigma_n + \frac{V_{offset}}{A} \quad (15)$$

where $\sigma_n$ is the total input voltage noise variance, which is computed by input referring the receiver circuit noise and the effective clock jitter noise.

Figure 7A:
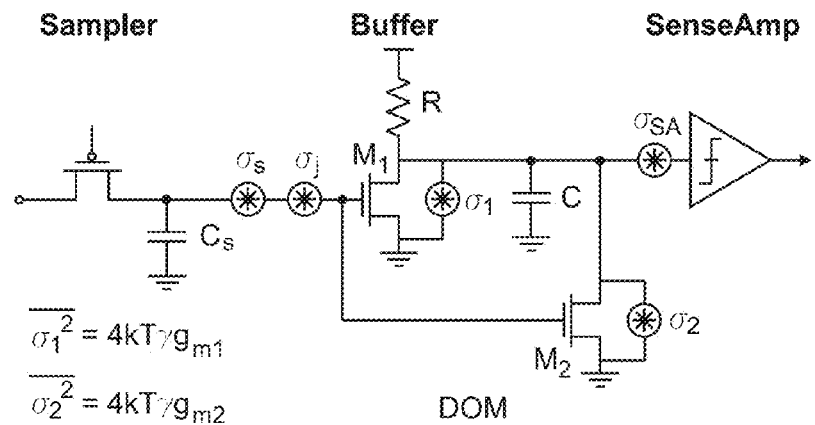
FIGS. 7A-7C show respectively, examples of the noise sources in the front-end, how the clock jitter is translated into the double-sampled voltage noise, and the optimum range, 15-25 fF, for the sampling capacitor to achieve maximum SNR.

The main sources of noise in the RC front-end are the sampler noise, buffer noise, sense-amp noise, and, finally, clock jitter noise, as shown in FIG. 7A. The single-ended version is shown for simplicity. The sense amplifier is modeled as a sampler with gain and has an input referred voltage noise variance of $$\overline{\sigma_{SA}^2} = \frac{2kT}{A_{vsa}^2 C_A} \quad (16)$$

Where $C_A$ is the internal sense amplifier node capacitance, which is set to approximately 15 fF in order to obtain sufficient offset correction range. The sense amplifier gain $A_{vsa}$ is estimated to be equal to near unity for the 0.8 V common-mode input level set by the buffer output, resulting in a sense amplifier voltage noise sigma of 0.75 mV. The buffer noise can be written as $$\overline{\sigma_A^2} = \frac{2kT\gamma}{C} \quad (17)$$

where is the transistor noise coefficient. According to simulation, the input-referred voltage noise variance of the buffer stage is equal to 0.6 mV$_{rms}$ while it provides about 6 dB of gain. Sampler voltage noise variance is equal to $$\overline{\sigma_S^2} = \frac{2kT}{C_S} \quad (18)$$

where the factor of two is due to the two sampling capacitors employed in the sampler block, which generate the differential input voltage to the buffer.

Figure 7B:
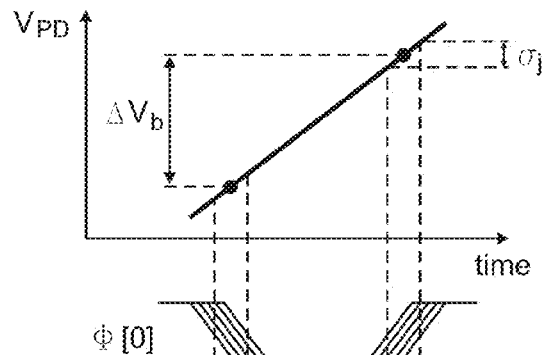

Clock jitter also has an impact on the receiver sensitivity because any deviations from the ideal sampling time results in a reduced double-sampled differential voltage, as shown in FIG. 7B. This timing inaccuracy is mapped into an effective voltage noise on the input signal with a variance of $$\overline{\sigma_J^2} = \left(\frac{\sigma_{CLK}}{T_b}\right)^2 \Delta V_b^2. \quad (19)$$

Using the measured clock jitter of about 1 ps$_{rms}$, it is estimated to be about 0.5 mV$_{rms}$. As shown in FIG. 7B, DOM also contributes some noise to the system. The total noise due to DOM can be written as $$\overline{\sigma_{DOM}^2} = \frac{\beta^2}{2A^2} \left(\overline{\sigma_J^2} + \overline{\sigma_S^2} + 2\overline{\sigma_A^2}\right) \quad (20)$$

Where A is the buffer DC gain. As β/A≪1, the noise contribution of the DOM is negligible.

Combining the input-referred circuit noise and effective clock jitter noise, ignoring $\sigma_{DOM}$, results in the total input noise power equal to $$\sigma_n = \sqrt{\sigma_S^2 + \sigma_A^2 + \frac{\sigma_{SA}^2}{A^2} + \sigma_{CLK}^2}. \quad (21)$$

Figure 7C:
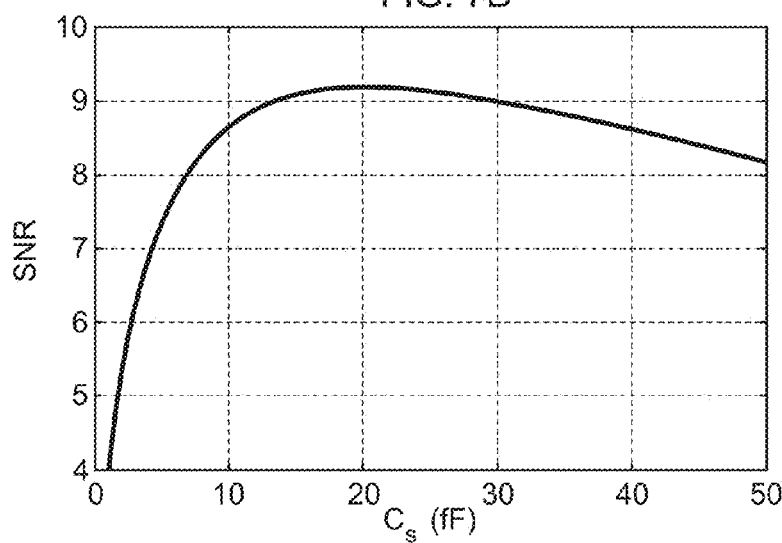

FIG. 7C shows how the input SNR changes with the sampling capacitor for an estimated total input capacitance of about 250 fF. The maximum SNR is achieved for $C_S$ equal to approximately 20 fF. However, a large sampling capacitor requires a large switchsize in order to maintain performance at high data rate. This creates a tradeoff between power consumption and data rate as clock buffer power consumption increases with the switch size. As a result in this example design $C_S$ is chosen to be about 15 fF to both achieve high SNR and remain in the flat part of the SNR curve to minimize sensitivity to process variation and at the same time reduce the power consumption due to clock buffers. A dummy transistor with half the size of the sampling transistor may also be added to the sampler to minimize clock feedthrough.

In order for the receiver to achieve adequate sensitivity, it is essential to minimize the sense amplifier input-referred offset caused by device and capacitive mismatches. While the input-referred offset can be compensated by increasing the total area of the sense amplifier [16], this reduces the buffer bandwidth by increasing input capacitance and also results in higher power consumption. Thus, in order to minimize the input-referred offset while still using relatively small devices, a capacitive trimming offset correction technique may be used [14]. In this technique the capacitance is digitally adjusted to unbalance the amplifier and cancel the offset voltage. The residual offset is limited by the minimum offset cancelling capacitance possible.

As shown in FIG. 6, digitally adjustable nMOS capacitors attached to internal nodes and cause the two nodes to discharge at different rates and modify the effective input voltage to the positive-feedback stage. Using this technique, an offset correction range of 60 mV with a residual of 0.9 mV may be achieved. The fixed input common-mode voltage provided by the buffers eliminates variability in the offset correction magnitude as the input signal integrates over the input voltage range. The maximum input optical power is set by the requirements of the sampling switches and the transistor oxide breakdown voltage. In order to accurately sample the input voltage in a bit time, on-resistance of the switch should be sufficiently low. Given the 15 fF sampling capacitor, for a 20 Gb/s input, the on-resistance of the transistor should be less than 1 KΩ in order for the resulting time constant to be sufficiently small for the sampled voltage to settle to its final value within a bit interval, 50 picoseconds (ps). For the employed 65-nm CMOS technology, this translates to a 0.4-V minimum possible voltage at the integrating node $V_{min}$. On the other hand, the maximum possible $V_{PD}$ is equal to the oxide breakdown voltage $$V_{PD\,max} - V_{PD\,min} = RI_{1\,max} = R\rho P_{max}. \qquad (22)$$

In this design, the variable resistor (R) at the input changes from about 0.8 to 4 KΩ, which allows the receiver to operate for up to 0-dBm input optical power with a photodiode responsivity of about 1 A/W. According to simulation, the receiver may operate at higher input optical powers as the double-sampled voltage is quite large, however the excessive voltage at $V_{PD}$ will stress the transistors connected to this node. The minimum input optical power is determined by the noise performance of the front-end as explained earlier in this section.

In a fabricated prototype, the DOM coefficient β may be adjusted manually. In the following, an adaptive algorithm is introduced which can automatically set β for optimum operation. In addition, the required clock signals may be provided provided from off-chip. In a complete system the clock may be generated on-chip using a CDR. A bang-bang CDR technique can be applied to the novel receiver as described in the next section.

4. Design Considerations for an Exemplary Optical Receiver Embodiment

A number of additional design considerations such as adaptation techniques for DOM, scaling behavior of the receiver, and suitable clocking techniques can be readily evaluated by those skilled in the art. The feasibility of these techniques is validated through circuit- and system-level simulations.

a. Adaptation of Dynamic Offset Modulation

Figure 8:
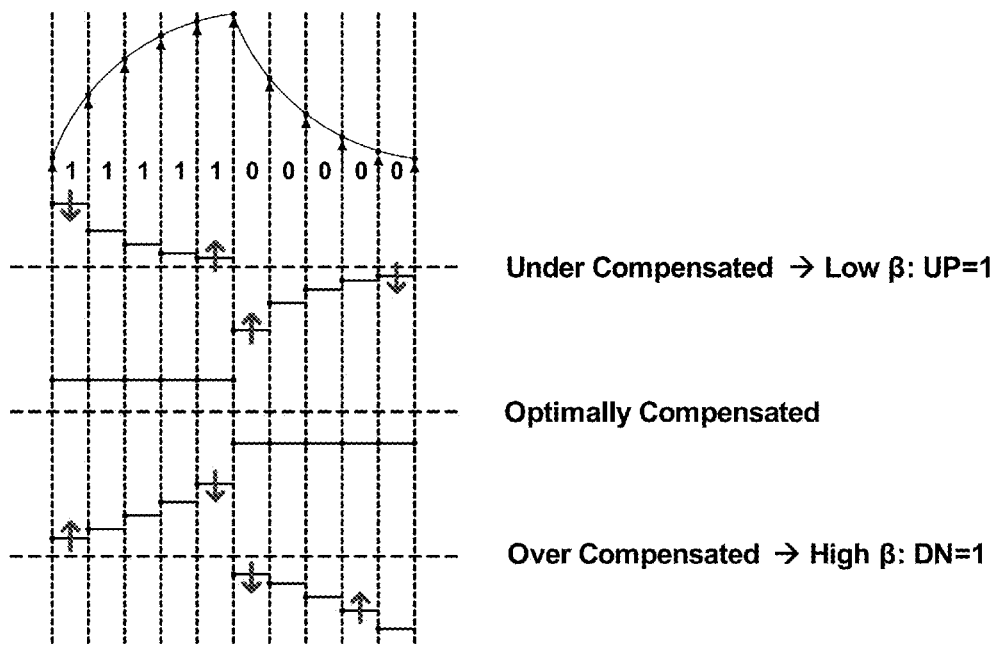
FIG. 8 illustrates basic operation of the DOM gain β adaptation algorithm where the error signal is generated for certain pattern depending on the difference between ΔV[n] and ΔV[n−1]

As previously shown, the DOM coefficient depends on the front-end time constant (RC). As a result, at the beginning of the operation and in order to maintain the operation of the receiver over slow dynamic variations such as temperature or supply drifts, an adaptation technique should be employed. The RC front-end may be considered first without the DOM. As previously discussed and illustrated in FIG. 8, consecutive ones or zeros generate double-sampled voltages that are not equal. In fact, it is clear that the first bit generates a larger $|\Delta V[n]|$ than the second bit does. This difference can be employed as an error signal to adjust the DOM coefficient β. In this example, a bang-bang-controlled loop is employed in which the sign of the error signal is used to correct the coefficient with constant steps. The corresponding UP/DN commands can be generated by simply duplicating the comparator part of the RC front-end. However, the new comparator should compare the two voltage differences. The modified sense amplifier to implement this task is shown in FIG. 9B.

Figure 9A:
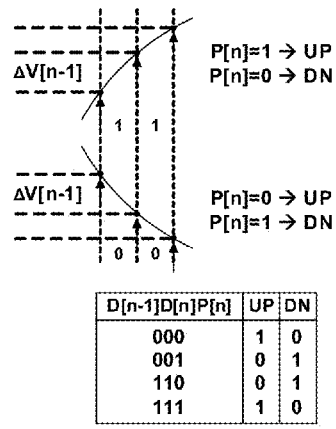
FIG. 9 illustrates (A) input waveform and error detection, (B) modified sense amplifier (SA) as the difference comparator, (C) samplers and comparators for error detection, (D) a bang-bang adaptation loop, (E) simulated performance of the front end before DOM adaptation, (F) simulated performance of the front end after DOM adaptation, wherein in (E) and (F) Gaussian noise with σ=10 mV is applied at the sampler, (G) receiver current sensitivity versus photodiode capacitance with and without scaling sampling capacitor, and (H) receiver data rate versus photo diode capacitance for 100 microamp sensitivity.
Figure 9B:
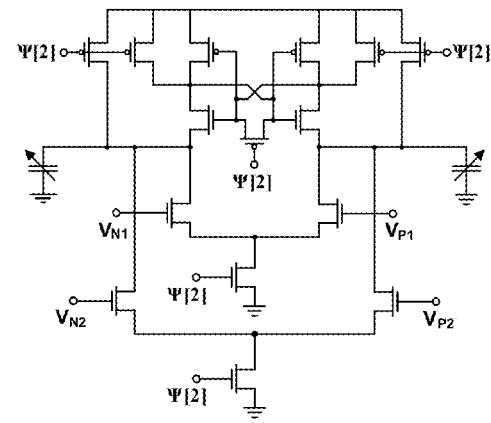
Figure 9C:
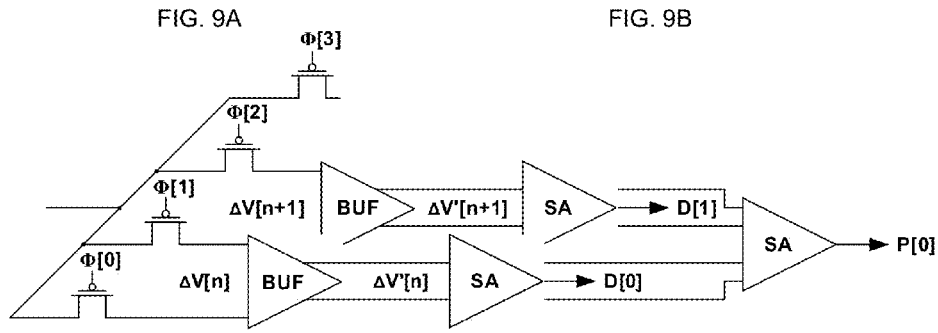

FIG. 9A shows the example input voltage waveform of the RC front-end upon receiving the data. As an example, a "11" data pattern may be used. For this particular pattern, if β is equal to the optimal value, the two double-sampled voltages $\Delta V[n-1]$ and $\Delta V[n]$ will be equal. Any error in β would lead to nonequal $\Delta V[n-1]$ and $\Delta V[n]$. The error direction, low or high, determines the sign of the error difference between the two double-sampled voltages for the "11" pattern. Therefore, if each double-sampled voltage is compared with its previous one, the result can be used for β adjustment. The operation is similar to normal data resolution where each sample V[n] is compared with a one-bit older sample V[n−1]. Modified comparators, which generate P signals in FIG. 9C, are added to the front-end for this purpose. The error information for the adaptation loop is now the difference in the two double-sampled voltages and the 2-b pattern that corresponds to samples V[n−1] to V[n+1]. Not all 2 bit patterns provide error information for the adaptation loop. The valid patterns are those that give equal $\Delta V[n-1]$ and $\Delta V[n]$ when β is adjusted to its optimal value. "11" and "00" are patterns that have such error information. The table in FIG. 9A lists valid patterns with the corresponding condition for a meaningful result. Out of four possible 2 bit patterns, two give information for adaptation loop. The effective probability of getting phase information from a random input is close to 0.5 when long sequences of ones or zeros do not happen often. Long sequences of ones or zeros result in near zero $\Delta V[n-1]$ and $\Delta V[n]$, which does not provide error information.

Figure 9D:
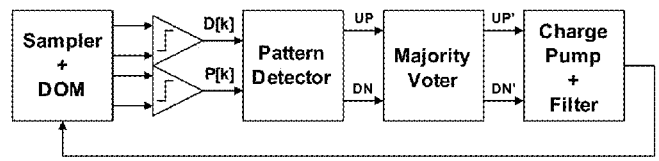
Figure 9E:
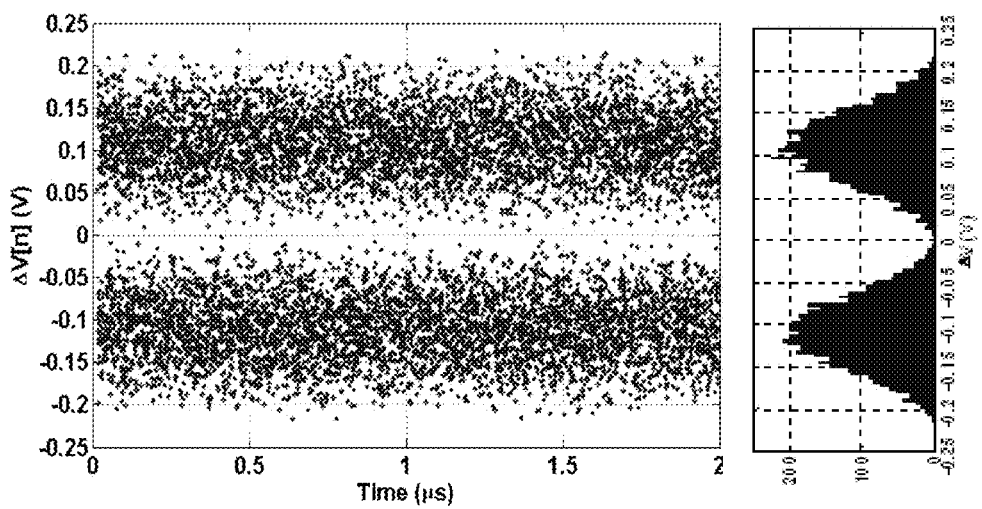
Figure 9F:
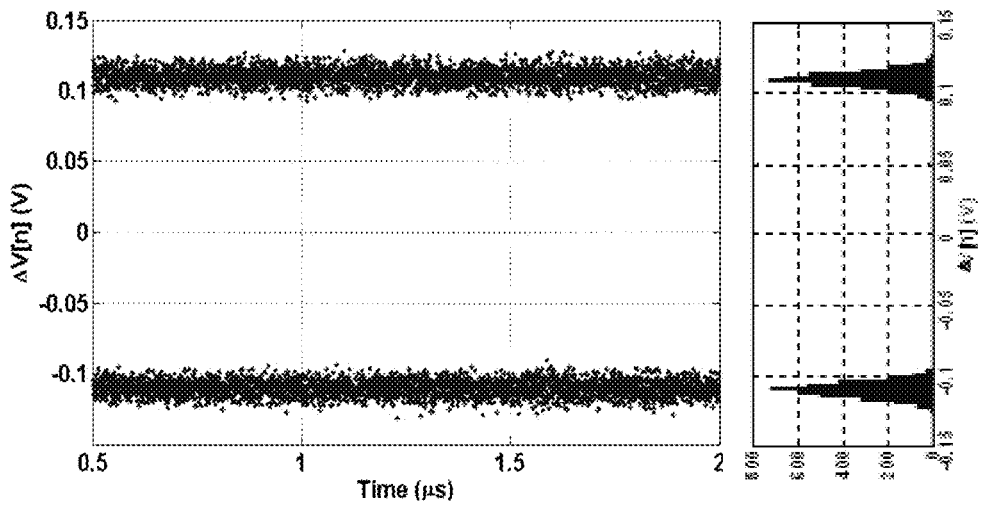

A block diagram of a bang-bang-controlled gain adjustment loop is shown in FIG. 9D. This is a first-order loop and, hence, it is unconditionally stable. From the incoming data, two sets of samplers and comparators resolve the data, D signals, and raw error information, P signals. A pattern detector then generates the UP/DN correction commands for the loop. The UP/DN commands are filtered and used to adjust β. For instance, in the case where the RC time constant is equal to 200 ps and $T_b$=50 ps, optimal β is about 0.23 according to equation (8). As a result, when the loop is closed, β will converge to this quantity, which can also be confirmed by closed-loop circuit-level simulations. FIG. 9E shows the output of the sampler, $\Delta V[n]$, when DOM and adaptation circuits are disabled. Applying DOM with the adaptation loop creates a constant double-sampled voltage difference, as shown in FIG. 9F. The variation in the double-sampled voltage is due to the sampler noise of σ=10 mV incorporated in the simulations.

The adaptation loop can be designed to operate only occasionally to correct for slow variations, and the same hardware can be reused for clock recovery as explained hereafter.

b. Scaling

Figures 9G, 9H:
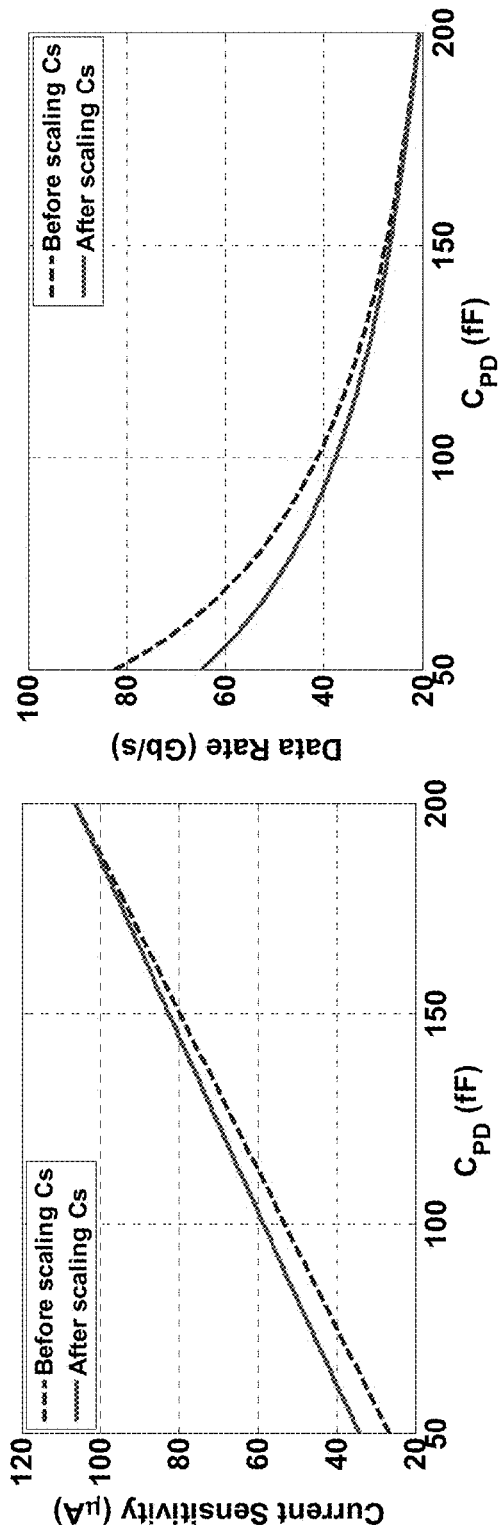

Silicon photonics has offered high-performance optical components, such as Germanium photodiodes, waveguides and modulators. This integration allows for very small photodiode parasitic capacitance. Here, the effect of photodiode capacitance scaling on the performance of the proposed receiver is evaluated. According to equation (10), the double-sampling voltage is inversely proportional to the photodiode capacitance. As a result, larger double-sampling voltage can be achieved using a smaller parasitic capacitance. This allows for scaling the receiver sensitivity $P_{avg}$ for a fixed data rate. This argument is valid under this assumption that no charge sharing happens between the photodiode capacitance and the receiver sampling capacitors. In order to minimize this charge sharing, a certain ratio between the photodiode capacitance and the sampling capacitor has to be kept. In this example design, this ratio is chosen to be about 10. Therefore, while the photodiode capacitance is scaled, the sampling capacitor should also scale with the same rate. This in turn increases the kT/C noise of the sampler and degrades the front-end SNR. However, as the noise is inversely proportional to square root of the capacitor size, the overall SNR and hence the sensitivity of the receiver increases proportional to the square root of the photodiode scaling factor, as shown in FIG. 9G. For instance, in the case of a photodiode capacitance of 50 fF, double-sampling receiver achieves about 34 microamps (μA) of current sensitivity at 20 Gb/s, which improves to 17 μA at 10 Gb/s as the integration time is doubled. For an extinction ratio of 10 dB, this translates to about −20 dBm sensitivity. Therefore, the proposed receiver can greatly benefit in terms of sensitivity from advanced photodiode technologies with small parasitic capacitance and efficient integration techniques such as flip-chip bonding or nanopillars. On the other hand, as the photodiode capacitance scales to 10-20 fF, in the case of monolithically integrated photodiode, the charge sharing between the photodiode capacitance and the sampling capacitance limits the sensitivity of the receiver.

The receiver maximum data rate is also a function of the photodiode capacitance. According to $$R_b = \frac{1}{T_b} \quad (23)$$
$$= \frac{\rho P_{avg}}{2C_{in}\Delta V_b}$$
$$= \frac{\rho P_{avg}}{2C_{in}(SNR\sigma_n + V_{offset})}$$

for a given sensitivity, the data rate can be increased by Rb scaling the photodiode capacitance. As mentioned earlier, in order to minimize charge sharing, the sampling capacitor scales with the same rate as the photodiode capacitance. As a result the input referred-noise, $\sigma_n$, changes accordingly. For the target RX sensitivity of 100 μA, FIG. 9H shows how the data rate changes as the photodiode capacitance scales. The maximum achievable data rate is ultimately limited by the speed of transistors.

c. Clocking

An interesting problem in a clocked integrating front-end is to recover the clock from the incoming data. As mentioned previously, the clock jitter could be one of the limiting factors in the receiver sensitivity. As a result, an efficient low jitter clocking technique is crucial. For highly parallel links, a dual-loop CDR [17] can be employed with one loop for the frequency synthesis, which can be shared between all of the channels, and the other for phase correction in each channel (alternatively, in a source-synchronous clocking scheme, the frequency synthesis loop can be eliminated, and a phase correction loop will be sufficient). An alternative technique is to employ a forwarded-clock scheme in a WDM link using one of the channels (wavelengths), which allows for simple phase correction loops to set the optimal sampling time.

The most common phase detection technique employed in electrical signaling is the 2×-oversampled phase detector known as an Alexander phase detector [18]. A similar technique can be applied to the proposed double-sampled front-end. FIGS. 10A & 10B show the DOM output voltage upon receiving a one-zero transition. The front-end samples the signal in the middle of each bit-period $V_m[n]$ and $V_m[n-1]$. At any transition, if the clock is in-phase with data, the two samples taken at the middle of these consecutive non-equal bits are expected to be equal. Any phase error would cause these two voltages to be different. This difference can be used as an error signal to adjust the phase of the sampling clocks. In order to implement the clock recovery loop, the samplers/comparator part of the front-end can be duplicated. This set of samplers/comparators needs to be clocked with an extra clock phase, shifted by half a bit-period.

Figures 11A, 11B:
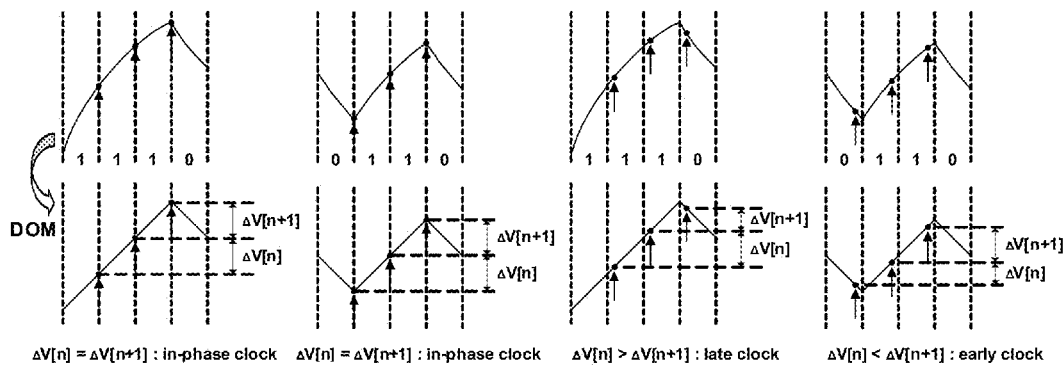
FIGS. 11A-11B show input waveform and baud rate phase detection for in-phase and out-of-phase clock, respectively, for a receiver embodiment of the invention.

Removing the extra phases for oversampled phase recovery can help to reduce the power consumption in the oscillator and clock buffers and relax the difficulties of phase spacing control. The RC front-end allows us to create an efficient baud-rate phase recovery scheme similar to [9], [19] based only on data samples as shown in FIG. 11. The difference between this method and the one proposed in [19] is that instead of extacting the phase error data from the sampled input, the double-sampled voltage difference at the output of the DOM, $\Delta V[n-1]$ and $\Delta V[n]$ in FIGS. 11A & 11B, are employed. This is similar to β adaptation loop except that instead of looking at a 2 bit pattern, 4 bit patterns are investigated. As an example, a "0110" data pattern in FIGS. 11A & 11B may be chosen to explain the operation of this technique. It is clear from the figure that, for this particular pattern, if the sampling clock is in-phase with the incoming data, then $\Delta V[n-1]$ and $\Delta V[n]$ will be equal. Any error in the sampling clock phase would lead to nonequal $\Delta V[n-1]$ and $\Delta V[n]$. The phase error direction, early or late clock, determines the sign of the error difference between the two samples for this pattern. Therefore, if each two consecutive double-sampled voltages are compared, the resulting information can be used for phase recovery. The valid patterns for phase corrections are those that give equal $\Delta V[n-1]$ and $\Delta V[n]$ when the clock is synchronized with the incoming data. "1001" and "0110" are patterns that have complete early/late phase information. Most other patterns have conditional phase information, e.g. 1110 only gives valid results when the clock leads the input.

Due to the less update density in the baud-rate phase detection technique, the overall loop gain is smaller compared to the conventional 2×-oversampling by almost a factor of 2.67 [19]. As a result, 2×-oversampling phase correction loop provides higher bandwidth, for identical loop filter and charge-pump, and hence superior jitter tolerance. On the other hand, the baud-rate phase detector has the additional advantage of being less sensitive to clock phase errors, as the same clocks are used for both the data and phase samples, whereas the 2×-oversampling detector relies on quadrature phase matching.

Another important aspect of the phase correction loop is its effect on the operation of the β correction loop. As explained earlier, these two loops operate based on the same correction signal P to minimize the difference between the two consecutive double-sampled voltages, ΔV'[n−1] and ΔV'[n]. As a result, they can operate concurrently to adjust β and clock phase. This can be validated in simulation for a PRBS7 pattern when the initial phase is about half UI apart from the optimal point. The bandwidth of the β and phase correction loop in this simulation can be approximately 2 MHz. The experiment can be repeated for the case where the clock phase was leading and lagging with respect to the optimal clock phase as well as over and undercompensated β.

As mentioned earlier in this section, the only difference between the adjustment loop and the CDR loop is the length of the pattern that should be monitored. As a result, the same hardware (P comparators) employed in the adaptation loop can be reused to perform clock recovery except for the pattern detection logic. This allows for savings in power consumption and area.

An exemplary embodiment of the invention can be fabricated in a 65-nm CMOS technology with the receiver occupying less than 0.0028 mm as shown in FIGS. 12A & 12B. It can comprise two receivers, one with a photodiode emulator and one for optical testing with a photodiode. In the first version, an emulator can mimic the photodiode current with an on-chip switchable current source and a bank of capacitors ($C_{PD}$) is integrated to emulate the parasitic capacitances due to photodiode and bonding (PAD and wirebond). The four phases of clock are provided from an off-chip signal generator as shown. An on-chip CML-to-CMOS converter can generate the full swing clocks to the receiver. The on chip clock may have about 9 ps peak-to-peak jitter.

Figure 13B:
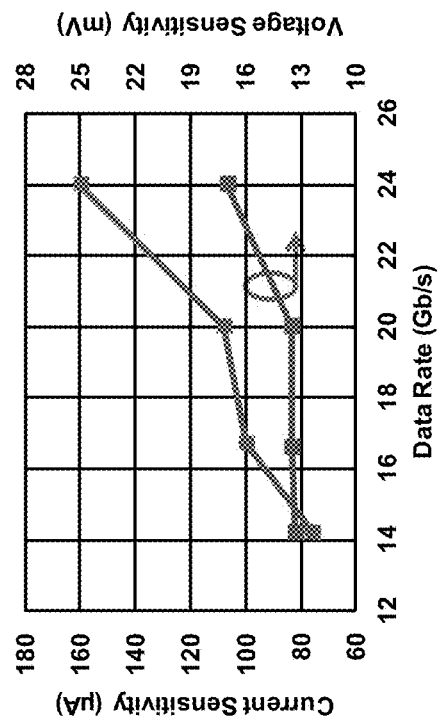
FIG. 13 illustrates (A) receiver sensitivity characteristics for different data rates and (B) current, voltage sensitivity versus data rate, (C) power consumption and efficiency at different data rates, and (D) receiver power breakdown for an example embodiment of the invention.
Figure 13A:
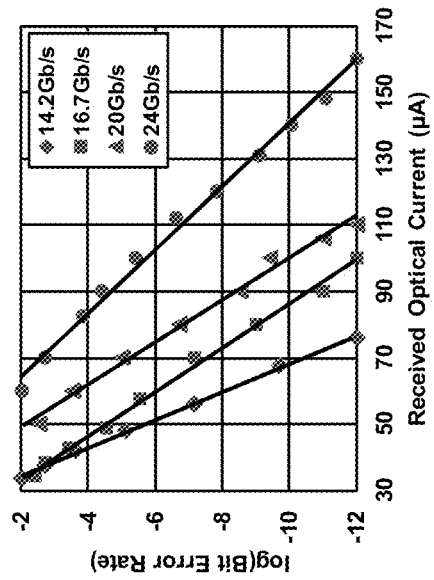
Figure 13C:
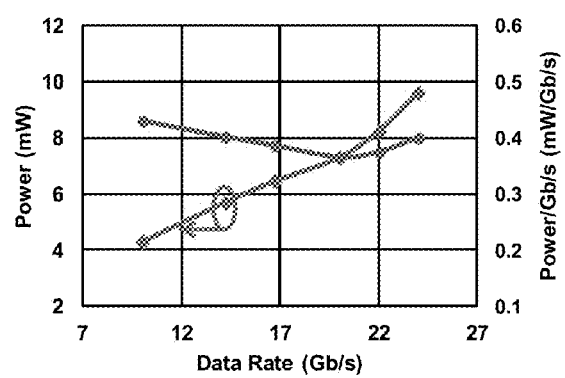
Figure 13D:
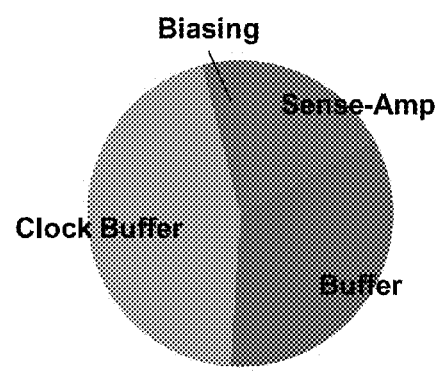
Figure 14A:
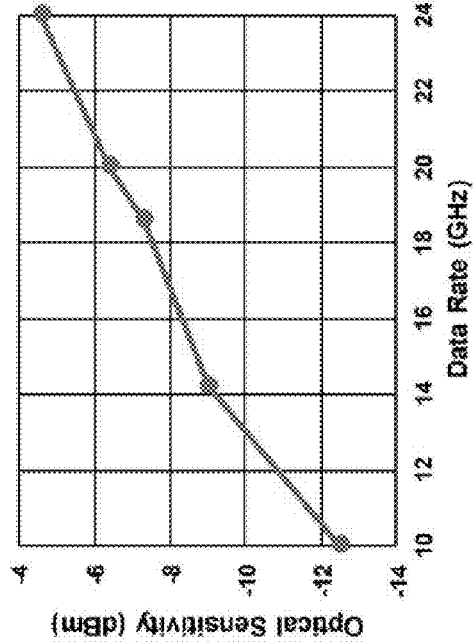
FIGS. 14A-14C illustrate optical sensitivity characteristics for different data rates and a comparison between voltage sensitivity for electrical and optical measurement for an example embodiment of the invention.
Figure 14B:
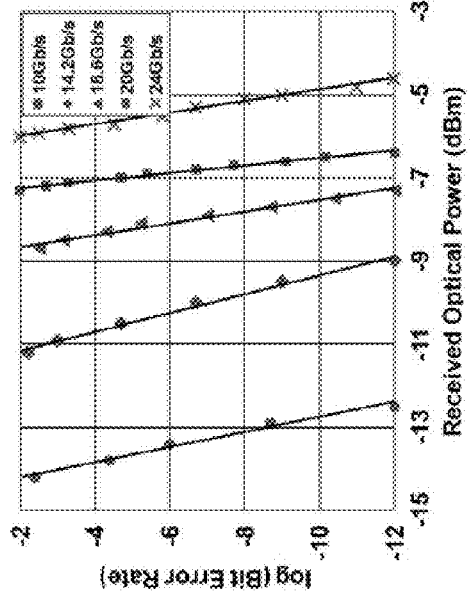
Figure 14C:
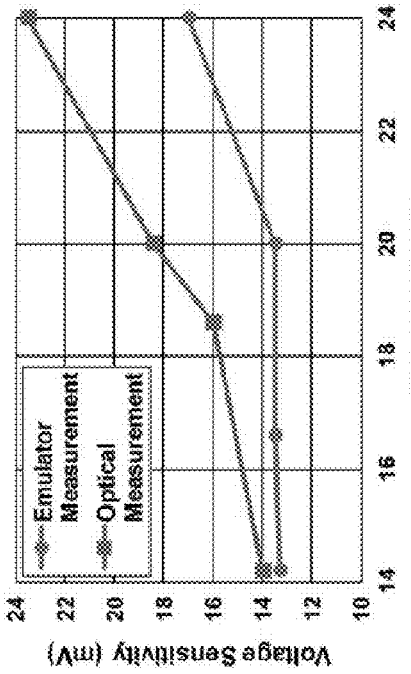

The functionality of the receiver may first be validated using the on-chip emulator and PRBS7, PRBS9, PRBS15 sequences. R and $C_{in}$ may be 2.2 KΩ and 250 fF ($RC_{in}$>550 ps). FIG. 13A shows how the bit error rate changes with the input current at 14.2, 16.7, 20, and 24 Gb/s. For all these data rates the condition is valid. The receiver achieves about 75 μA of sensitivity at 14.2 Gb/s, which reduces to 160 μA at 24 Gb/s. Due to the integrating nature of the receiver, the current sensitivity almost linearly increases with data rate, as shown in FIG. 13C. The voltage sensitivity of the receiver is measured to be about 13 mV up to 20 Gb/s and increases to 17 mV at 24 Gb/s, which is believed to be partly due to degradation of the eye opening at the emulator input. The receiver power consumption (including all clock buffers) at different data rates is shown in FIGS. 14A-14C. The power increases linearly with the data rate as the receiver employs mostly digital blocks. The receiver offers a peak power efficiency of 0.36 pJ/b at a 20-Gb/s data rate. In order to validate the functionality of the DOM for long sequences of ones or zeros, a 200 MHz square-wave current can be applied as the input to the receiver while the front-end sampled the input at 20 Gb/s. In this case, 50 consecutive zeros are followed by 50 ones. For an input time constant of about 0.55 ns, this number of zeros or ones pushes the input to the flat region were close to zero double-sampling voltage, ΔV'[n], is obtained. Enabling the DOM resulted in error-free detection of the received pattern.

Figure 15A:
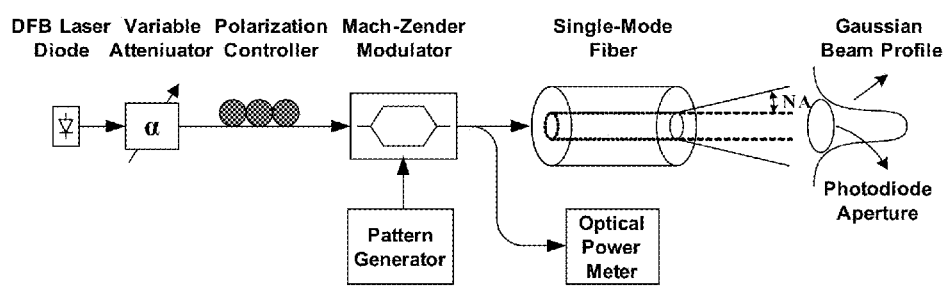
FIG. 15A shows an optical test setup for an example embodiment of the invention.
Figure 15B:
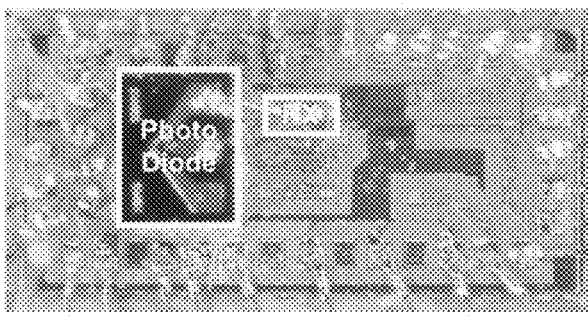
FIG. 15B shows a micrograph of the receiver with bonded photodiode.
Figure 15C:
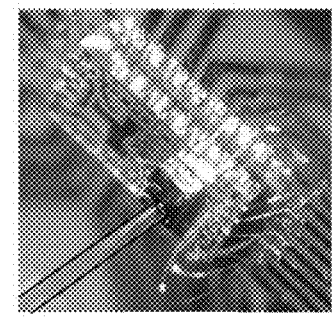
FIG. 15C shows coupling laser through fiber to the photodiode, FIGS. 15D and 15 E show optical input eye diagram to the photodiode at 14 and 24 Gb/s respectively.
Figure 15D:
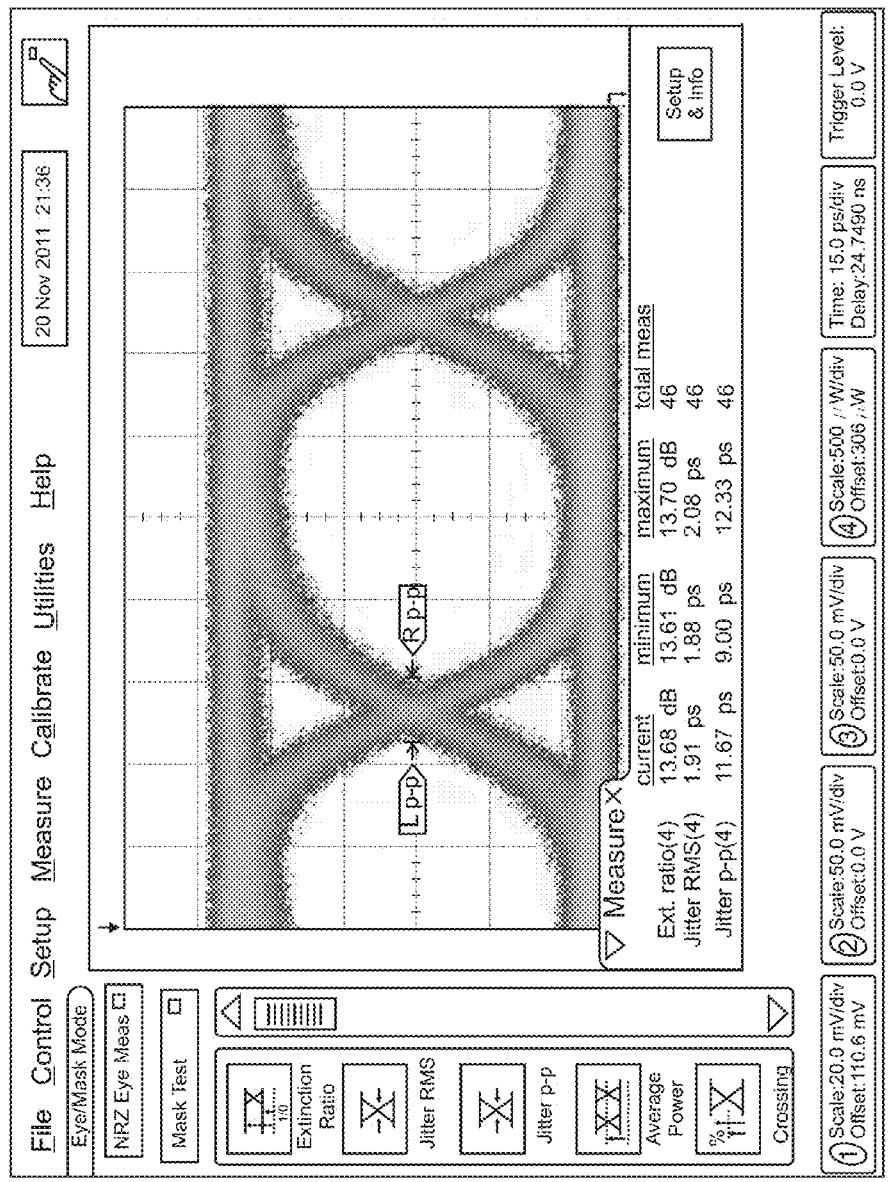
Figure 15E:
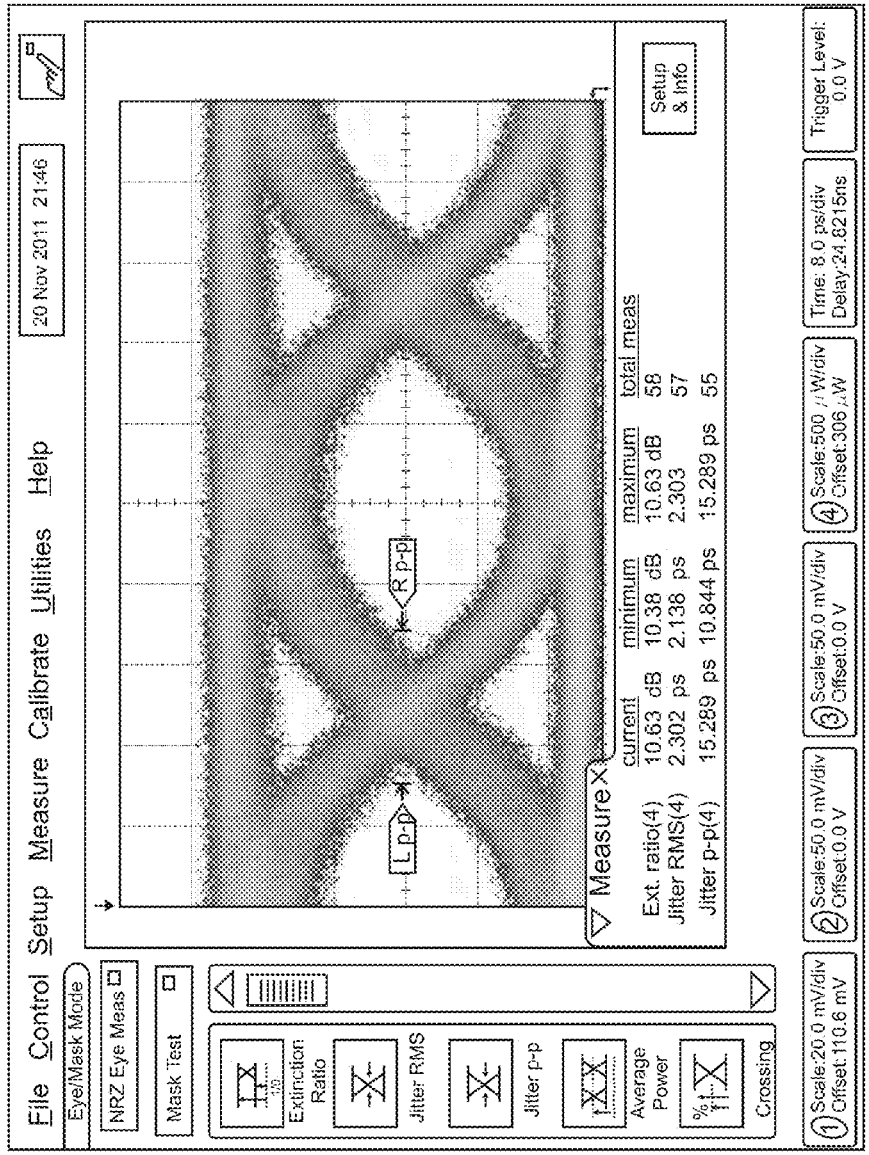

In a second set of measurements, the receiver can be wire-bonded to a high speed photodiode and tested at different data rates. The photodiode, bonding pad, wire-bond, and the receiver front-end are estimated to introduce more than 200 fF capacitance. FIG. 15 shows the optical test setup. The optical beam from a 1550 nm DFB laser diode may be modulated by a high-speed Mach-Zender modulator and coupled to the photodiode through a single-mode fiber. The optical fiber may be placed close to the photodiode aperture using a micropositioner. The responsivity of the photodiode at this wavelength is about 1 A/W. As the beam has a Gaussian profile, the gap between the fiber tip and the photodetector causes optical intensity loss. This, combined with the optical connectors and misalignment introduce some loss, which can be characterized by comparing the sensitivity in the two experiments. Current and optical power sensitivity are related according to $$P_S = \frac{\rho I_S}{2} \times \frac{(1 + 10^{\frac{-EB}{10}})}{(1 - 10^{\frac{-ER}{10}})}. \tag{24}$$

where $P_S$ is the optical power sensitivity, $I_S = I_1 - I_0$ is the current sensitivity and ER is the extinction ratio. The measured extinction ratio at 14.2 Gb/s is about 13 dB using the external modulator. As a result, the nominal optical sensitivity according to the current sensitivity of 75 μA will be equal to −14 dBm. The difference between the nominal and measured optical sensitivity is about 5 dB, which is believed to be due to the coupling loss. This difference grows as the data rate increases due to the limited bandwidth of the external modulator. Therefore, the sensitivity can improve by employing advance optical packaging technologies. FIGS. 14A and 14B show how the sensitivity of the receiver changes with data rate. Note that the coupling loss is not considered in this plot. The receiver achieves more than −12.5 dBm of sensitivity at 10 Gb/s, which reduces to −7.3 dBm at 18.6 Gb/s and −4.6 dBm at 24 Gb/s. The maximum optical power at which the receiver was tested is 0 dBm. This is the maximum power available from the measurement setup. As mentioned in previous section, the variable resistor at the front-end allows for a wide range of optical input power. For large input optical power the variable input resistor can be reduced to avoid saturation. FIG. 14C compares the calculated voltage sensitivity (BER<$10^{-12}$) achieved for the electrical and optical input experiments. In both cases, the voltage is calculated by using equation (12) and the measured current sensitivity. As expected, the sensitivity of the receiver degrades with data rate. In the electrical test the receiver achieves almost constant voltage sensitivity regardless of the data rate. However, for the optical experiment, the calculated voltage sensitivity degrades as data rate increases. The excessive sensitivity degradation in the optical test is due in part to the wire-bonded photodiode and limited bandwidth of the optical modulator, which causes reduced vertical and horizontal eye opening as shown in FIGS. 15D and E.

Table 1 summarizes the performance of the proposed optical receiver and compares it with other methods.

TABLE I

PERFORMANCE SUMMARY AND COMPARISON WITH OTHER REFERENCES

|  | This work | [4]* | [6] | [8] | [9]* | [10] |
| --- | --- | --- | --- | --- | --- | --- |
| Technology | 65 nm | 130 nm | 65 nm | 40 nm | 90 nm | 130 nm SOI |
| Supply | 1.2 V | 1.8 V | 1.0 | 1.0 V | 1.0 V | 1.25 V |
| Data Rate | 24 Gb/s | 12.5 Gb/s | 25 Gb/s | 10 Gb/s | 16 Gb/s | 10 Gb/s |
| Power | 0.4 pJ/b | 3.5 pJ/b | 3 pJ/b | 0.4 pJ/b | 1.4 pJ/b | 1.5 pJ/b |
| Area | 0.0028 mm² | 0.15 mm² | 0.4 mm² | — | 0.025 mm² | 0.9 mm² |

TABLE I-continued

PERFORMANCE SUMMARY AND COMPARISON WITH OTHER REFERENCES

|  | This work | [4]* | [6] | [8] | [9]* | [10] |
|---|---|---|---|---|---|---|
| RX $C_{in}$ | >200fF | 110fF | — | <60fF | 440fF | <20fF |
| Sensitivity | −4.7 dBm** | −8.5 dBm*** | −7.3 dBm | −15 dBm | −5.4 dBm | NA**** |

Figure 16A:
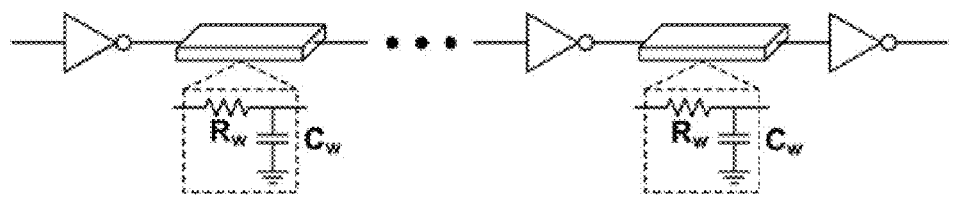
FIG. 16A shows a repeater based on chip link.
Figure 16B:
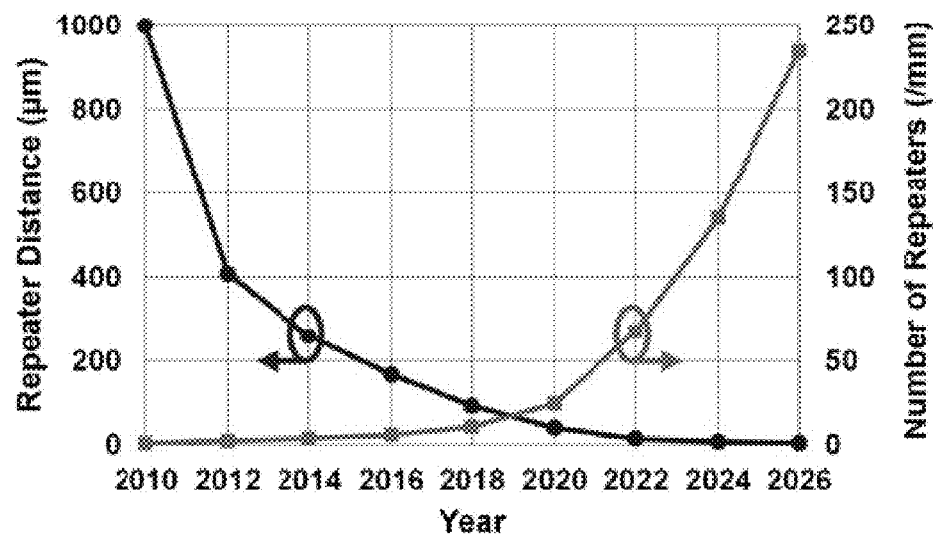
FIG. 16B shows the distance and number of repeaters for an optimally repeated wire in different technology nodes [1]

*Require 8B/10B encoded data to ensure DC balance
**Coupling loss is not considered @24 Gb/s, about 5 dB loss is expected.
***Sensitivity @10 Gb/s
****6 μA current sensitivity 5. Electrical Signalling and Application to on Chip Interconnects a. Introduction As VLSI technologies and multi-core processor chips continue to scale, long on-chip wires will present increasing performance limitations. While transistors favor from technology scaling, the shrinking cross-sectional area of the on-chip wires increases electrical resistance and hence their latency, which has a quadratic relation with the wire length. Simple inverter-based repeaters can partially mitigate the latency problem, where an optimal design makes the repeated wire delay linear with length instead of quadratic. However, the associated power and area become prohibitive as the technology scales due to the increased number of repeaters per unit length, FIG. 16A-B. Low-swing differential signaling [23]-[27], current-mode signaling [28], [29], equalization [27], [30] and transmission lines [23], [28] have been employed to resolve the energy and latency problem of the repeated links. However, these techniques are becoming less adequate in meeting bandwidth density and power requirements.

Due to the RC nature of the on-chip wires, binary signals suffer from a long train of post-cursor inter-symbol interference (ISI). To eliminate ISI, equalization techniques such as decision feedback equalization (DFE) can be utilized, but, the long post-cursor tail necessitates many DFE taps, which results in significant power overhead. This problem is exacerbated as the technology scales. RC signal emulation in a DFE, is also an attractive solution to eliminate many taps of post-cursors. The main limiting factor in this technique is to meet the timing requirement in the feedback loop, especially at high data rates.

b. Electrical Signaling Receiver Architecture

Applying the principle of the receiver embodiment previously described, one or more embodiments can achieve an on-chip link using minimum-pitch wires for high-speed signaling to address the bandwidth requirement of future microprocessors. One or more embodiments can employ the double-sampling technique with a feed-forward dynamic offset modulation (DOM) to achieve high data rates over minimum-pitch and long on-chip wires that suffer from excessive loss and latency. In order to further improve data rate and reduce power consumption, a capacitively-driven transmitter [25] may be employed. One or more embodiments achieve low power consumption, high bandwidth density and scalability to future technology nodes.

Figure 16C:
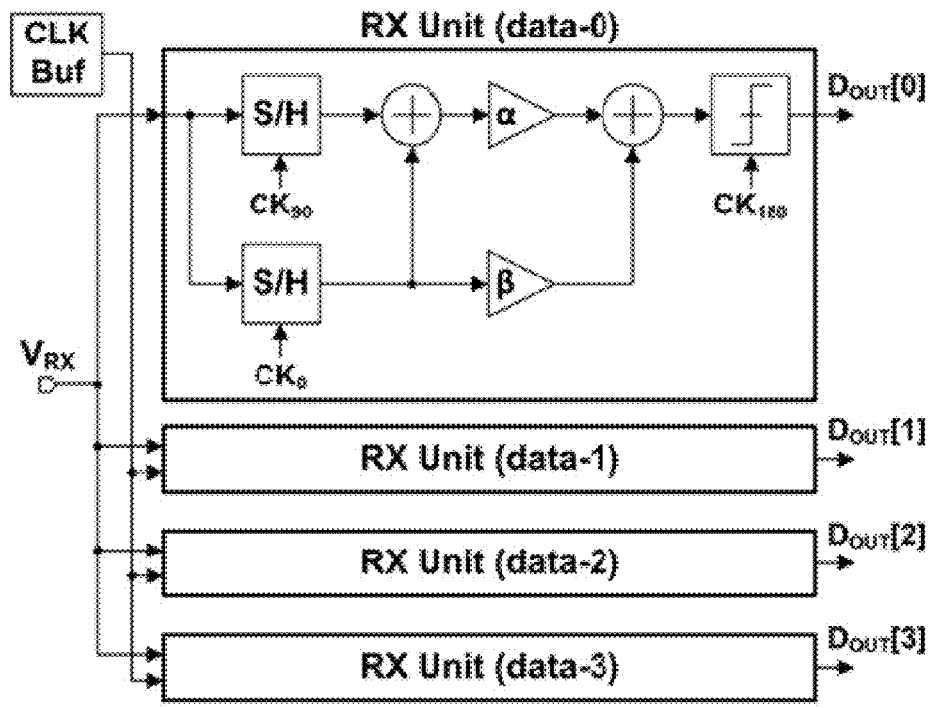
FIG. 16C-D show exemplary top level architecture for an on-chip link embodiment of the invention.
Figure 16D:
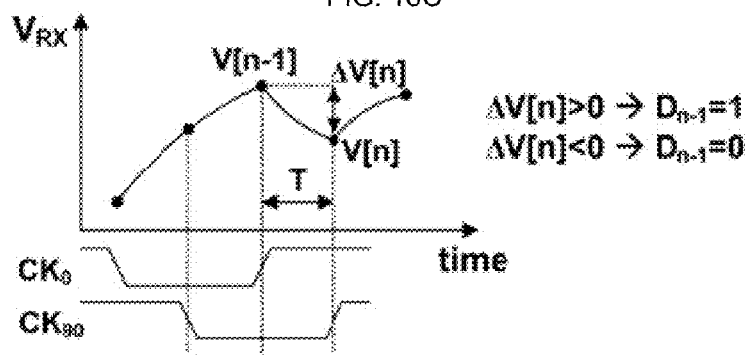

Minimum-pitch wires can have a slow exponential response to a fast transition, with a time-constant (τ) much larger than the bit time (T). Instead of conventional equalization techniques, a mostly-digital double-sampling technique may be applied to break the tradeoff between the data-rate and the on-chip wire time-constant. FIG. 16C-D shows exemplary top level architecture for an on-chip link embodiment of the invention.

Figure 16E:
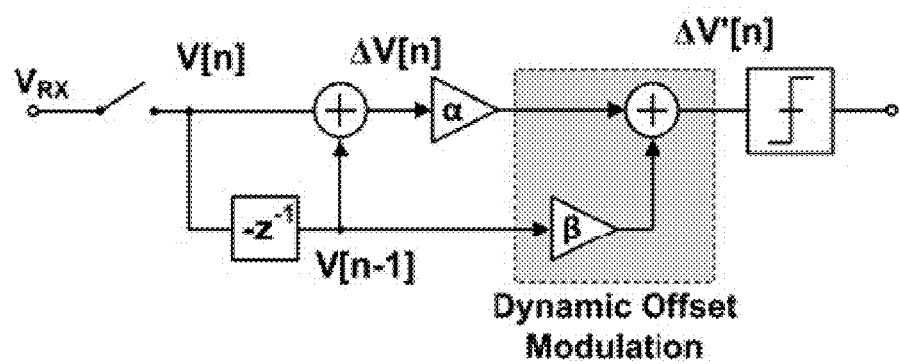
FIG. 16E shows z domain representation of the double sampler and the dynamic offset modulation.

As shown in FIG. 16D, the input voltage is sampled at the end of two consecutive bit times (V[n−1], V[n]) and these samples are compared to resolve each bit: ΔV[n]=V[n]−V[n−1]>0 results in 1, and ΔV[n]<0 results in 0 following the analysis previously described. Note that the overall sampling rate is still equal to the data rate. This double-sampled voltage (ΔV[n]) will be input-dependent due to the channel transfer function, FIG. 16F. To resolve this problem, the offset of the next stage comparator can be dynamically modulated to provide a constant voltage at its input regardless of the data sequence. In this receiver, an offset proportional to the previous sample, V[n−1], is applied to the comparator. For instance, in case of a large ΔV[n]=ΔV$_{max}$ (e.g. a one after many zeros), or a very small ΔV[n] (e.g. a zero after many zeros), an offset equal to ΔV$_{max}$/2 is subtracted resulting in ΔV'[n]=ΔV$_{max}$/2, and −ΔV$_{max}$/2, respectively as shown in FIG. 16F. The same scenario is true for the opposite case. FIG. 16E shows the z-domain representation of the double-sampling and the dynamic offset modulation technique. Assuming a dominant pole of $\omega_p=1/\tau$, it can be shown that for an exponential signal, dynamic offset modulation can eliminate the input dependency of the double-sampled voltage if DOM gain, β, is equal to $$\beta = \alpha(1 - e^{\frac{-T}{\tau}}) \tag{25}$$

where α is the main path gain. This results in a constant double-sampled voltage, ΔV'[n], equal to $$\Delta V'[n] = \frac{\alpha}{2}(1 - e^{\frac{-T}{\tau}}) = \frac{\alpha}{2}\Delta V_{max}.$$

Another advantage of this technique is the capability to perform immediate demultiplexing at the front-end. A quarter-rate architecture (multiplexing factor of 4) is employed in this design. As a result, the comparators can operate in a fraction of the data rate.

Figure 16:
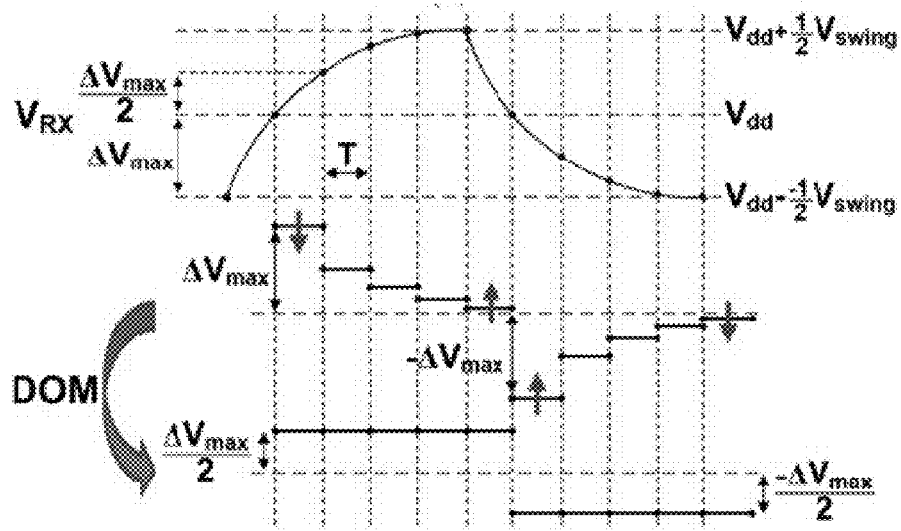
FIG. 16F shows operation of the DOM.
Figure 17A:
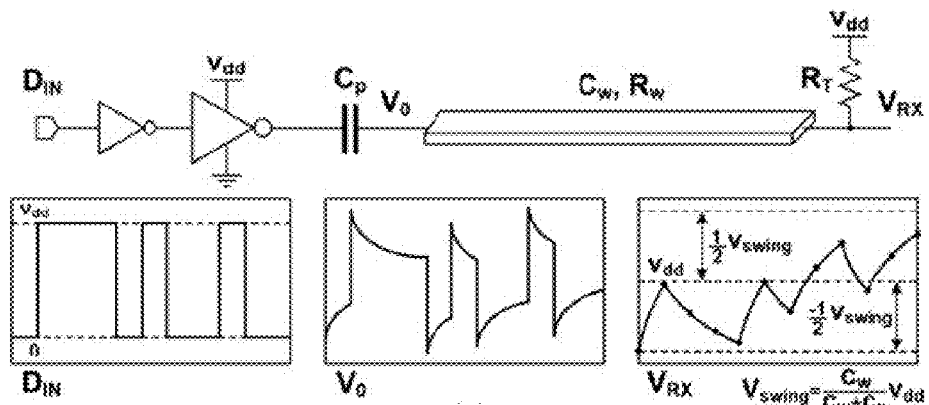
FIG. 17A shows a capacitively-driven transmitter and FIG. 17B shows applying double-sampling to resolve received data for an on-chip link embodiment of the invention.
Figure 17B:
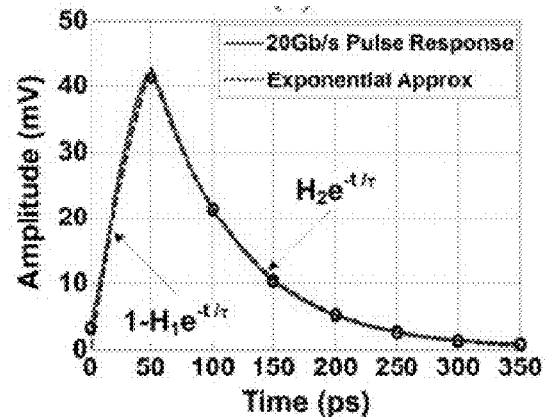

Utilizing low-swing signaling also reduces the power consumption in an on-chip interconnect, where most of the power is associated with the dynamic charging and discharging of the wire capacitance ($C_w$). A separate supply can be employed for an inverter-based transmitter to reduce the signal swing and hence improve power efficiency. However, it is not desirable to have multiple supplies on chip, as it makes the power distribution complicated. An alternative approach to achieve low swing is to drive the wire through a capacitor, $C_p$. This helps reducing the signal swing on the wire through a capacitive voltage divider. Ignoring the parasitic capacitance associated with the driver and the receiver, the resulting signal swing at the receiver side will be equal to $C_w/(C_w+C_p) \times V_{dd}$. This capacitor also pre-emphasizes transitions and reduces the driver's load. Because it acts as a high-pass filter, the capacitor increases the bandwidth of the wire by almost a factor of $C_w/C_p$ and decreases latency. FIG. 17 shows the capacitive driver and the resulting signals at the input and the output of the wire. As shown in FIG. 16, the receiver input has an exponential behavior.

c. Exemplary Implementation

In this embodiment a capacitive driver is employed to achieve small voltage swing and reduce power consumption. It should be noted that the coupling capacitor limits the maximum number of consecutive ones/zeros due to the voltage drift associated with the high-pass behavior of the link. As a result, the coupling capacitor, Cp is optimized to reduce the time constant of the drift process while providing reasonable voltage swing and bandwidth enhancement. In this design a PMOS transistor realizes a 400 fF capacitor for the driver. This results in about 140 mV voltage swing over a 7 mm wire and less than about 1 mV drift in voltage after more than 40 consecutive ones/zeros. The termination resistor sets the receiver's DC voltage to Vdd.

Figure 18:
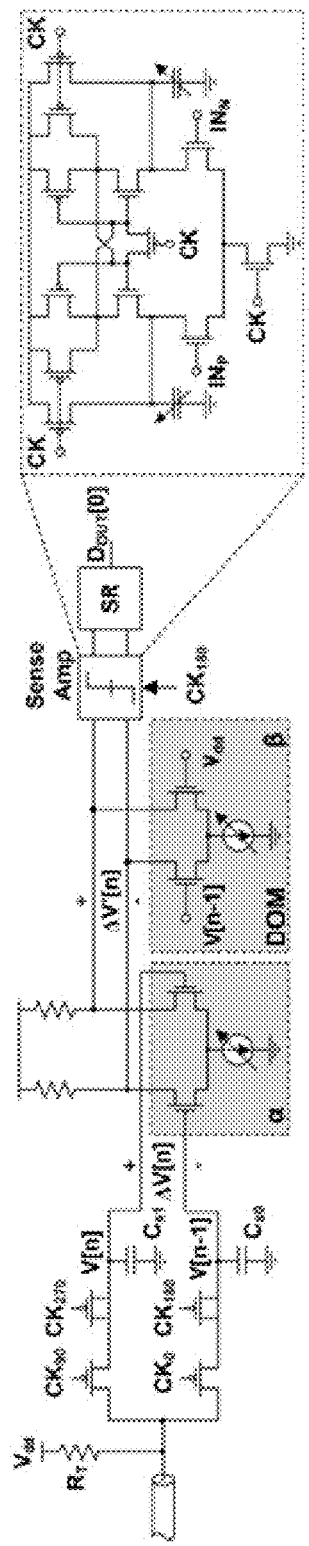
FIG. 18 shows a transistor level schematic of a receiver embodiment front-end and sense amplifier with capacitive offset cancellation for an on-chip link embodiment of the invention.

The high DC voltage at the input of the receiver guarantees best operation of the PMOS samplers as shown in FIG. 18. It also biases the PMOS coupling capacitor in the accumulation regime to ensure maximum capacitance and hence least area. The sampler utilizes dummy switches to reduce charge injection. The residual error due to charge sharing and clock feedthrough is removed by the double sampling technique, which performs the single-ended to differential conversion immediately at the receiver input. The input voltage is sampled by a bank of four sample/holds (S/H) driven by quarter-rate clock phases. The sampling capacitor Cs is chosen such that enough SNR for BER<$10^{-12}$ is achieved.

Figure 19A:
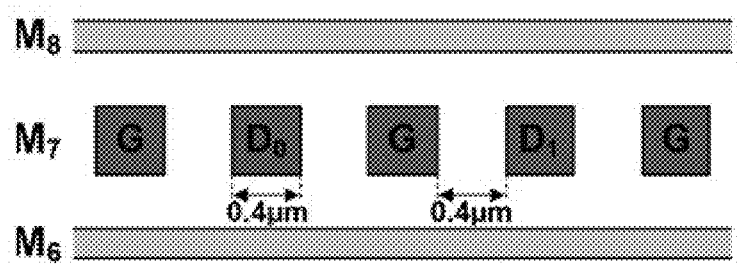
FIG. 19A shows a shielded single-ended on-chip wire and FIG. 19B shows simulated and measured characteristics of the on-chip wires for an on-chip link embodiment of the invention.
Figure 19B:
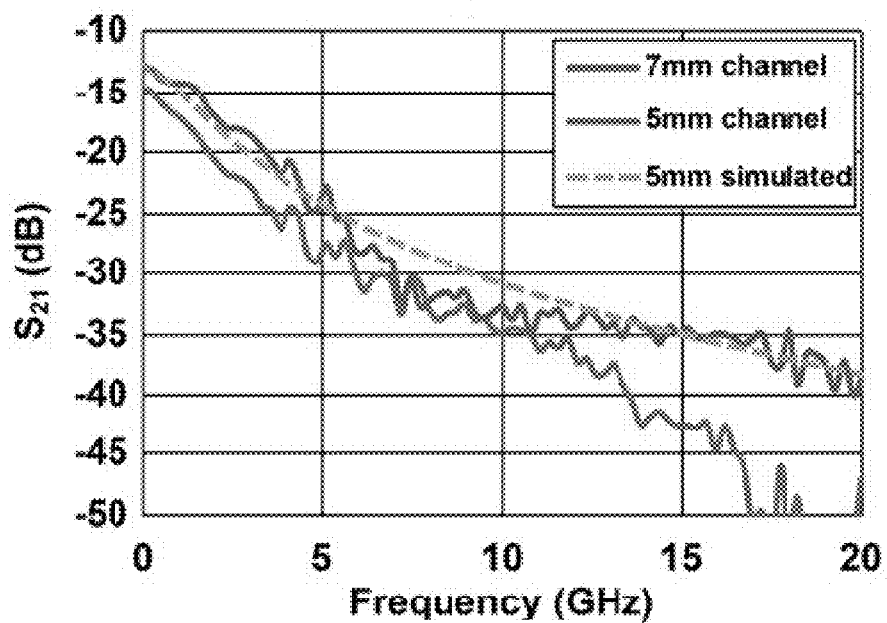

An amplifier with about 6 dB gain provides isolation between the sensitive sampling node and the sense amplifier. It also creates a constant common-mode voltage and prevents input dependent offset. A StrongARM sense amplifier may be employed to achieve high speed and low power. The sense amplifier has a separate offset cancellation for mismatch compensation through the variable capacitors shown in FIG. 18. The wires may be implemented using minimum-pitch (e.g., 0.4 μm width, 0.4 μm spacing or 0.36 μm width, 0.36 μm spacing) $M_7$ layer in the 9-metal process where $M_6$ and $M_8$ layers are densely populated to mimic orthogonal interconnects in a microprocessor chip. A shielded wiring structure may be employed to minimize coupling noise from adjacent lines, as shown in FIG. 19. This provides noise immunity while the doublesampling technique eliminates sensitivity to common-mode interferences at the receiver. FIG. 19 shows the simulated and measured characteristics of the 5 mm and 7 mm on-chip wires.

Figures 20A, 20B, 20C:
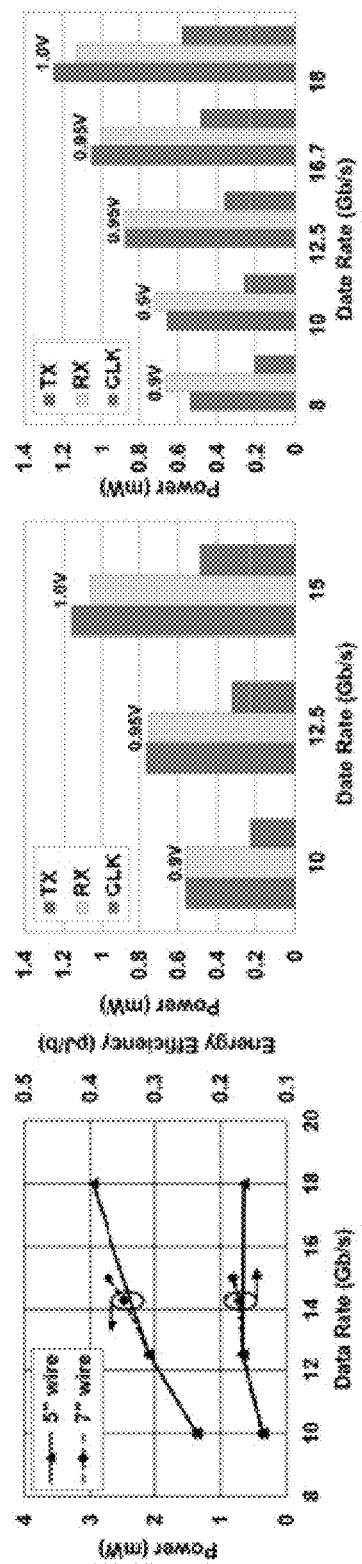
FIG. 20A shows power consumption.
FIG. 20B shows power breakdown for a 5 mm link.
FIG. 20C shows power breakdown for a 7 mm link, including all clockbuffers changes, as a function of data rate for an on-chip link embodiment of the invention.

An exemplary embodiment can be fabricated in 28 nm LP CMOS technology with the receiver and transmitter occupying less than 950 μm² and 160 μm², respectively. The functionality of the transceiver can be validated using single-ended on-chip wires with different lengths (4-7 mm). PRBS-7 to 31 data can be generated off-chip and sent to the on-chip transmitters. FIG. 20 shows how power consumption (including all clock buffers) changes with increasing the data rate. The 5 mm link operates up to 18 Gb/s while achieving better than 164 fJ/b power efficiency. As the link length and thus wire capacitance increases, signal swing at the receiver degrades. This results in a maximum measured data rate of 15 Gb/s for the 7 mm link. At this data rate the power efficiency is about 180 fJ/b. For the 1.6 μm wire pitch, the bandwidth density for the 5 mm and 7 mm links is 11.25 and 9.375 Gb/s/μm, respectively. For the 1.44 μm wire pitch, the bandwidth density for the 5 mm and 7 mm links is 12.5 and 10.42 Gb/s/μm, respectively. As this design employs mainly digital blocks, the power consumption almost linearly scales with data rate as shown in FIG. 20. An optimally repeated version of the link with the same geometry may also be simulated for comparison purpose.

Figure 21A:
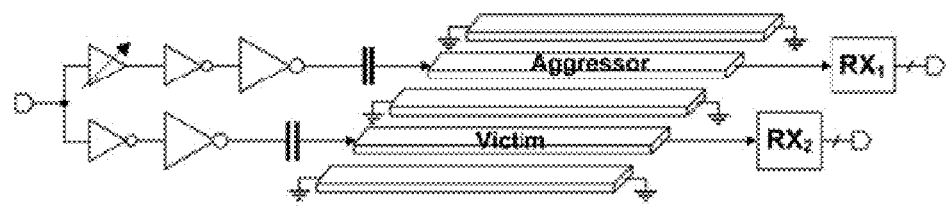
FIG. 21A-B show a crosstalk measurement setup and power consumption, respectively of a 4 mm link in the presence of an aggressor, for an on-chip link embodiment of the invention.
Figure 21B:
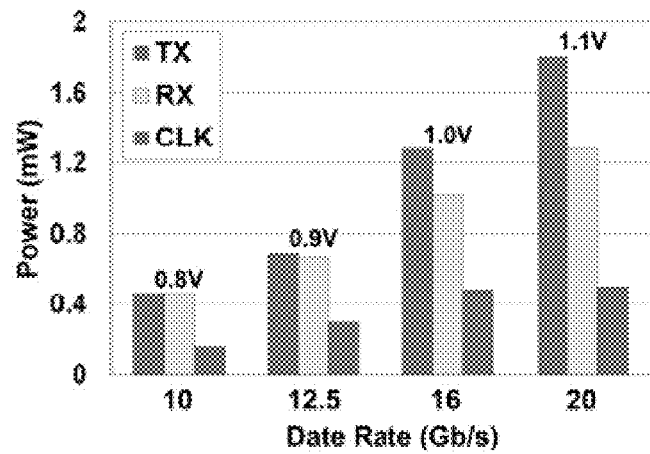
Figure 21C:
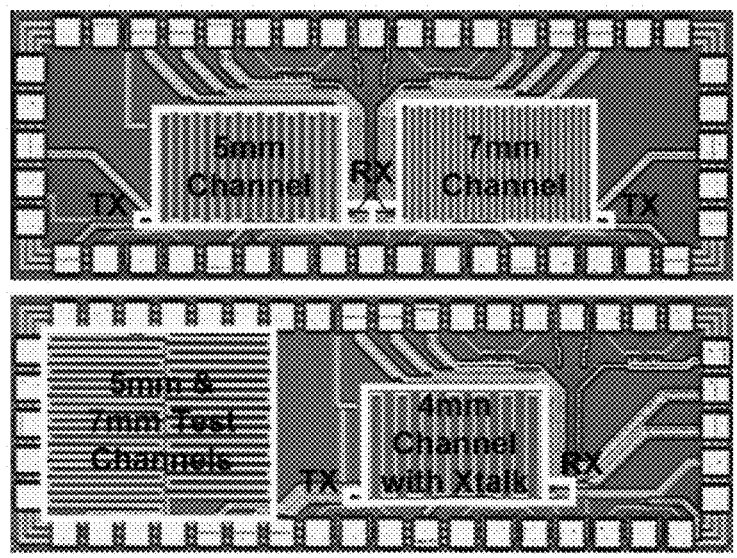
FIG. 21C shows a die micrograph.

The proposed link embodiment offers over 4× improvement in energy efficiency and about 40% lower latency compared to the repeated link. The receiver offers a peak energy efficiency of 136 fJ/b at 10 Gb/s data rate for 7 mm wires. The transceiver may also tested using a 4 mm wire. This link may be comprised of two adjacent wires to investigate the effect of crosstalk as shown in FIG. 21. Once the aggressor is activated while $V_{dd}$=0.95V the SNR drops due to the crosstalk noise, which causes an increase in the BER. By increasing the supply to 1V the BER ca be restored, which translates into about 5% degradation in the SNR due to the crosstalk. This level of crosstalk noise is comparable to a twisted differential architecture. The advantage of the shielded structure is that it eliminates the Miller capacitance that exist in a differential pair and hence offers a better power efficiency as well as area efficiency. It also provides a return path for the signal and hence limits the extent of magnetic coupling. The immediate single-ended to differential conversion provided by the double-sampling technique also minimizes the sensitivity to common-mode noise. Maximum data rate of 20 Gb/s with BER<$10^{-12}$ and 180 fJ/b of energy efficiency was achieved over this link embodiment of the invention.

Table 2 summarizes the performance of the proposed link and compares it with other methods.

|  | [23] | [24] | [26] | [27] | [29] | [31] | This Work |
|---|---|---|---|---|---|---|---|
| Technology | CMOS | CMOS | CMOS | CMOS | CMOS | CMOS | CMOS |
|  | 90 nm | 90 nm | 65 nm | 90 nm | 90 nm | 65 nm | 28 nm |
| Data Rate | 10 Gb/s | 4.9 Gb/s | 10 Gb/s | 2.0 Gb/s | 4.0 Gb/s | 20 Gb/s | 15 Gb/s-20 Gb/s |
| Length | 5 mm | 5 mm | 6 mm | 10 mm | 10 mm | 10 mm | 4-7 mm |
| Energy Efficiency | 0.27 pJ/b | 0.34 pJ/b | 1.0 pJ/b | 0.28 pJ/b | 0.36 pJ/b | 1.36 pJ/b | 0.136 pJ/b |
| Bandwidth Density | 0.5 Gb/s/μm | 4.38 Gb/s/μm | 2.56 Gb/s/μm | 1.16 Gb/s/μm | 2.0 Gb/s/μm | 1.5 Gb/s/μm | 9.375-12.5 Gb/s/μm |
| Bit Energy Efficiency | 54 fJ/mm | 68 fJ/mm | 174 fJ/mm | 28 fJ/mm | 36 fJ/mm | 136 fJ/mm | 19.5 fJ/mm |

6. Analysis of a Further Optical Receiver Embodiment

Figure 22:
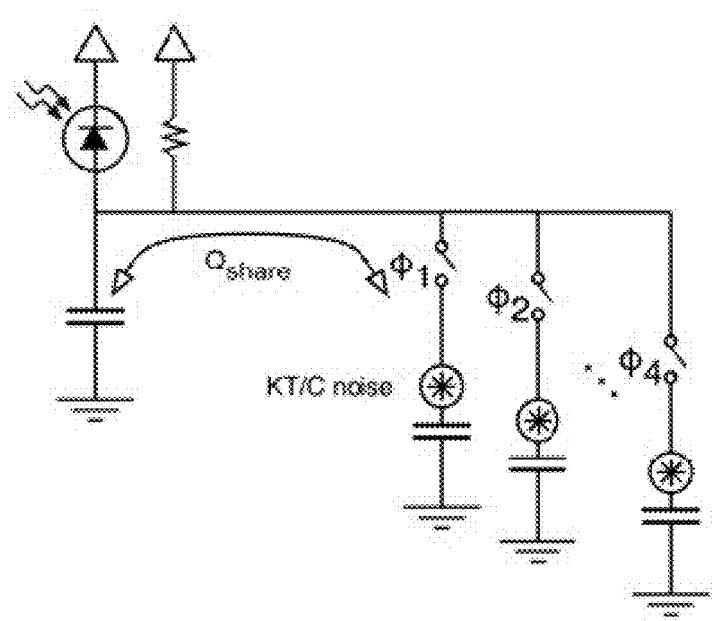
FIG. 22 illustrates the main problem that double sampling optical receivers face for scaled photonic technologies.

FIG. 22 illustrates a problem with scaling applied to double-sampling optical receivers. As the photonic technology scales, the photodetector cap scales down and leads to much lower current sensitivities. However, as Cp scales, sampling cap's charge-sharing deteriorates Cp's voltage. On the other hand, KT/C noise of sampling caps increases as sampling caps are scaled to compensate for charge sharing which degrades sensitivity. Given the minimum sampling cap size determined by the technology, this receiver topology cannot take advantage of photodetector cap scaling below a certain Cp.

FIG. 2 shows a double-sampling receiver with dynamic offset modulation. Instead of subtracting a DC current to maintain DC balance, a resistor terminates the photo-detector and dynamic offset modulation keeps double sampled voltage, $\Delta V$, constant. This method does not require any encoding and can operate at much higher speeds. For large photo-detector caps, a double-sampling receiver with dynamic offset modulation can operate at much higher speeds, not limited by TIA bandwidth or equalization loop bandwidth. As the photonic technology scales, the photo-detector cap scales down and leads to much lower current sensitivities.

Figure 23:
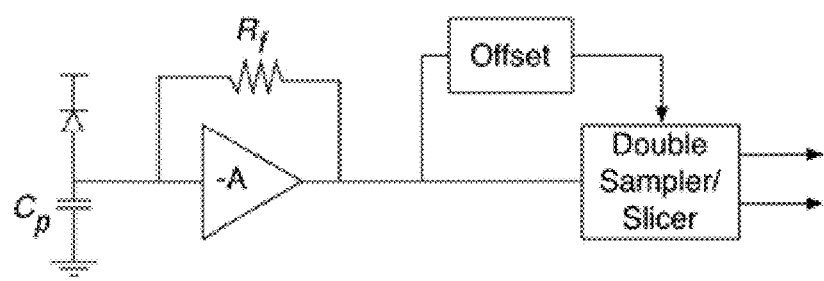
FIG. 23 is a schematic diagram of another exemplary double-sampling optical receiver embodiment of the invention.

FIG. 23 is a schematic diagram of an exemplary double-sampling optical receiver embodiment of the invention. Motivated by these shortcomings in double-sampling receivers with dynamic offset modulation (DOM), further embodiments of the present invention are directed to a low-bandwidth (LBW) TIA front-end that can enhance sensitivity as well as receiver speed while consuming negligible power. (Note this replaces the single resistor which functioned a basic TIA employed in the previous embodiment shown in FIG. 2.) Having a LBW TIA separates Cp from sampling capacitance, reducing charge-sharing, and leads to better SNR's and sensitivities. Also, sampling capacitance can be chosen to be larger, which further reduces KT/C noise.

Figure 24:
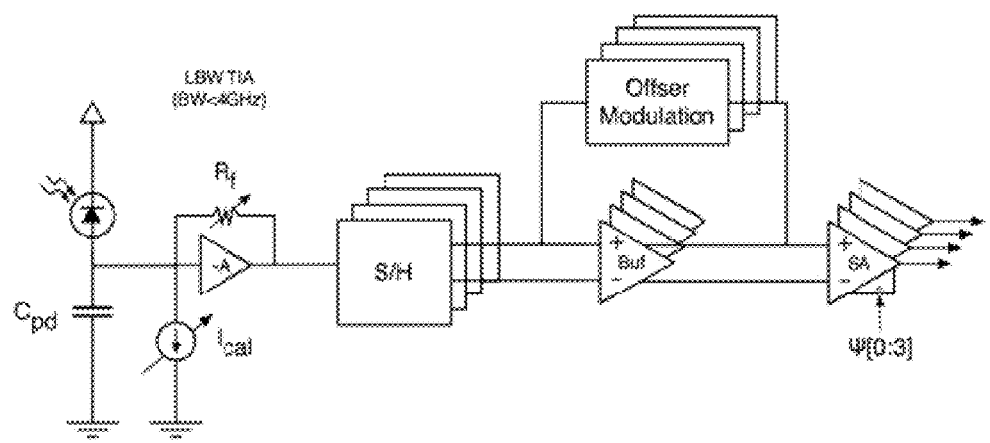
FIG. 24 is a schematic diagram of the front-end of the exemplary double-sampling optical receiver embodiment of the invention.

FIG. 24 is a schematic diagram of the front-end of the exemplary double-sampling optical receiver embodiment of the invention. The example system is a quarter-rate receiver. In the case of RC front-end, sampling voltage for a long sequence of 1's yields the following.

$$V_1[n] = RI_{pd}\left(1 - e^{-\frac{nT_b}{\tau}}\right)$$

And the difference of samples is given by:

$$\Delta V_1[n] = RI_{pd}\left(e^{-\frac{(n-1)T_b}{\tau}}\left(1 - e^{-\frac{T_b}{\tau}}\right)\right)$$

After dynamic offset modulation, $$\Delta V_1'[n] = RI_{pd}\left(e^{-\frac{(n-1)T_b}{\tau}}\left(1 - e^{-\frac{T_b}{\tau}}\right)\right) + RI_{pd}\left(\left(\frac{1}{2} - e^{-\frac{(n-1)T_b}{\tau}}\right)\left(1 - e^{-\frac{T_b}{\tau}}\right)\right) = \frac{RI_{pd}}{2}\left(1 - e^{-\frac{T_b}{\tau}}\right)$$

As a reminder, $\beta$, the DOM coefficient is chosen to be:

$$\left(1 - e^{-\frac{T_b}{\tau}}\right)$$

so that the resulting voltage is independent of n.

In the case of LBW TIA front-end there are two poles associated with the two nodes at the input and output of the LBW TIA.

$$V_2[n] = \frac{R_F I_{pd}}{1 + \frac{1}{A}}\left(2 - \left(e^{-\frac{nT_b}{\tau_1}} + e^{-\frac{nT_b}{\tau_2}}\right)\right),$$

where A is the gain of the amplifier and $R_F$ is the feedback resistance.

$$\Delta V_2[n] = \frac{R_F I_{pd}}{1 + \frac{1}{A}}\left(\left(e^{-\frac{(n-1)T_b}{\tau_1}}\left(1 - e^{-\frac{T_b}{\tau_1}}\right)\right) - \left(e^{-\frac{(n-1)T_b}{\tau_2}}\left(1 - e^{-\frac{T_b}{\tau_2}}\right)\right)\right)$$

In this case the DOM coefficient is chosen to be:

$$\left(1 - e^{-\frac{T_b}{\tau_2}}\right)$$

to cancel the dominant pole at the output of DOM. It should be noted that the time constant associated with the input and output nodes are approximately:

$$\tau_1 \approx \frac{R_f C_p}{1 + A}$$

$$\tau_2 \approx R_f C_L$$

For 28 nm technology the minimum controllable $C_L$, which is the load of 2 sampling caps is approximately 15 fF (at any time 2 sampling caps load the LBW TIA). The gain of a one stage inverter-based amplifier, optimized for power, is about A≈12 dB. So, for any $C_p$ smaller than 70 pF, $\tau_2$ is the dominant pole. Therefore $$\left(1 - e^{-\frac{T_b}{\tau_2}}\right)$$

is chosen to be the DOM coefficient to cancel sampling voltage variations due to the dominant pole.

$$\Delta V_2'[n] = \frac{R_F I_{pd}}{1 + \frac{1}{A}}\left(\left(e^{-\frac{(n-1)T_b}{\tau_1}}\left(1 - e^{-\frac{T_b}{\tau_1}}\right)\right) - \left(e^{-\frac{(n-1)T_b}{\tau_2}}\left(1 - e^{-\frac{T_b}{\tau_2}}\right)\right)\right) +$$

$$\frac{R_F I_{pd}}{1 + \frac{1}{A}}\left(\left(\frac{1}{2} - e^{-\frac{(n-1)T_b}{\tau_1}}\right)\left(1 - e^{-\frac{T_b}{\tau_2}}\right)\right) =$$

$$\frac{R_F I_{pd}}{1 + \frac{1}{A}}\left(\left(\frac{1}{2} + e^{-\frac{(n-1)T_b}{\tau_2}}\right)\left(1 - e^{-\frac{T_b}{\tau_2}}\right)\right)$$

The BER is determined and the eye is formed for n>>1

$$\Delta V_2'[n] = \frac{1}{2} \cdot \frac{R_F I_{pd}}{1 + \frac{1}{A}}\left(1 - e^{-\frac{T_b}{\tau_2}}\right)$$

Note that $\tau_1, \tau_2 \gg T_b$. Therefore, $$\Delta V_2'[n] \approx \frac{1}{2} \cdot \frac{I_{pf} T_b}{\left(1 + \frac{1}{A}\right) \cdot C_L}, \Delta V_1'[n] = \approx \frac{1}{2} \cdot \frac{I_{pf} T_b}{C_P}$$

In addition, note that the dominant pole associated with RC front-end is due to $C_p$ while the dominant pole associated with LBW TIA, for a small enough PD cap, is $C_L$.

Figure 25:
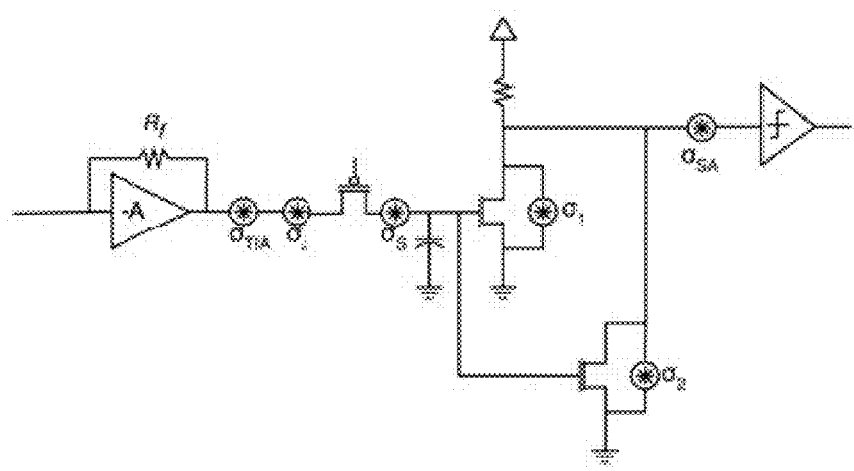
FIG. 25 is a schematic diagram showing noise sources for the exemplary double-sampling optical receiver.
Figure 26:
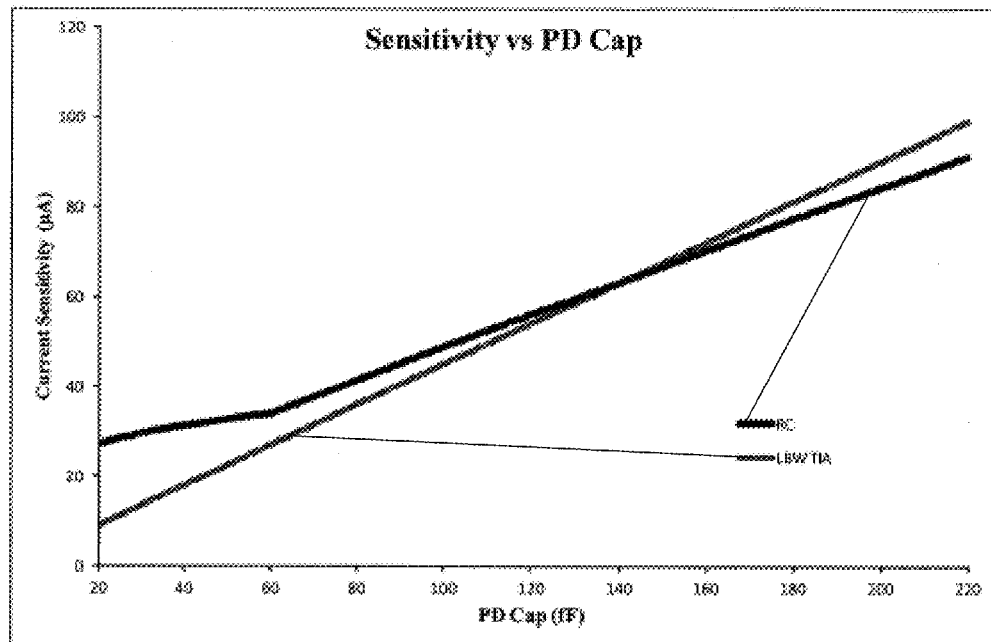
FIG. 26A is an example plot of current sensitivity versus photo-detector (PD) capacitance (cap) for RC and low-bandwidth transimpedance amplifier optical front-ends.
FIG. 26B is an example plot of sensitivity×power versus PD capacitance for RC and low-bandwidth transimpedance amplifier optical front-ends.
Figure 26:
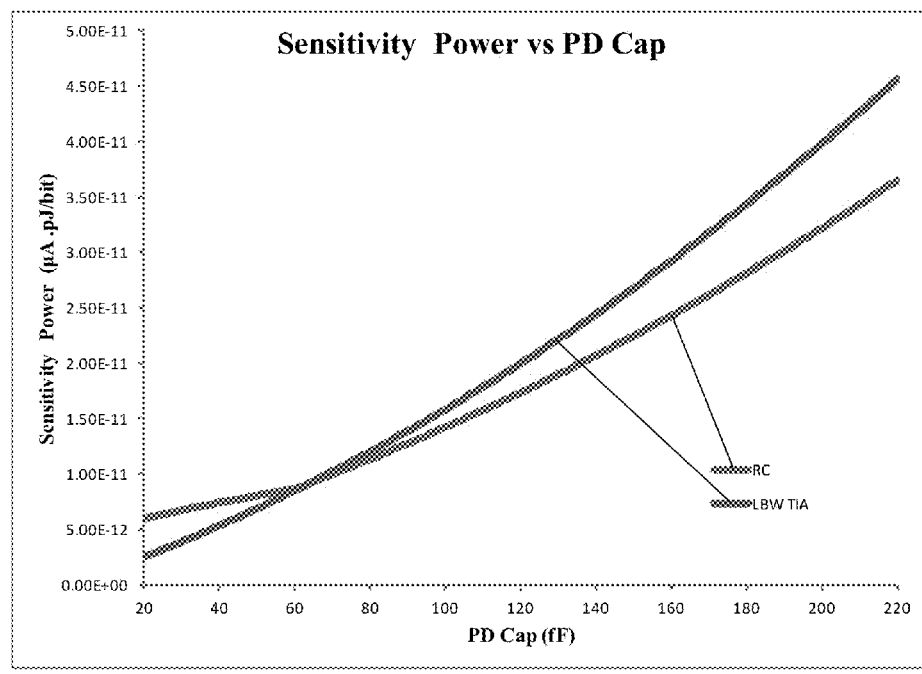

In order to analyze sensitivity of receiver, all noise sources are taken into account from PD to Sense-Amp as shown in FIG. 25. Referring all noise sources to the input node, an SNR of 8 is assumed to yield error-free operation. Incorporating associated noise sources, sensitivity of the two topologies can be been simulated for CMOS 28 nm technology. FIG. 26A is an example plot of current sensitivity versus PD capacitance for RC and low-bandwidth transimpedance amplifier optical front-ends. Note that the ratio of sampling caps to PD cap is assumed to be constant for $C_{pd}>60$ fF. Below 60 fF the sampling caps are assumed to be constant and equal to minimum controllable value which is $C_s=8$ fF. As can be seen, for photo-detector caps below 140 fF having a LBW-TIA front-end provides enhanced sensitivities.

Considering the small power overhead added by the LBW_TIA, a figure of merit (FOM) has been defined as FOM=sensitivity×power and is simulated to get a sense of where LBW TIA front-end is beneficial comparing to a simple RC front-end. For this FOM, a minimum of 70 fF PD cap is required to see the enhancement. FIG. 26B is an example plot of sensitivity×power versus PD capacitance for RC and low-bandwidth transimpedance amplifier optical front-ends.

Table 3 shows simulation results and a comparison of other optical receivers to the design according to one or more embodiments

|  | This Work | [33] | [34] | [35] | [36] | [37] | [38] |
|---|---|---|---|---|---|---|---|
| Technology | 28 nm | 130 nm | 90 nm | 40 nm | 45 nm | 65 nm | 90 nm |
| Method | LBW TIA Quarter Rate Double-Sampling | Resistor/Equalizer | 3 Stage TIA | 3 stage TIA | Quarter Rate 3-phased SA | Quarter Rate Double-Sampling | IIR-DFE Equalization |
| Input Cap (fF) | 20 | — | 45 | 60 | 5 | >200 | 140 |
| Max Speed | 27 Gb/s | 10 Gb/s | 5 Gb/s | 10 Gb/s | 3.5 Gb/s | 24 Gb/s | 9 Gb/s |
| Sensitivity (μA) | 30@20 Gb/s 50@27 Gb/s | 20 | 20 | 45 | 20 | 160@20 Gb/s 80@14 Gb/s | — |
| Power (pJ/b) | 200@20 Gb/s 220@27 Gb/s | 1500 | 690 | 395 | 52 | 360@20 Gb/s 400@24 Gb/s | 950 |

7. Pulse Amplitude Modulation

One or more embodiments can be further extended to more complex amplitude modulations with high spectral density such as 4-PAM in order to achieve higher data rate over bandwidth-limited channels. For instance, 4-PAM modulation achieves twice data rate as conventional OOK modulation with little extra complexity. This modulation can be employed both for the optical and electrical links.

9. Process Steps

Figure 27:
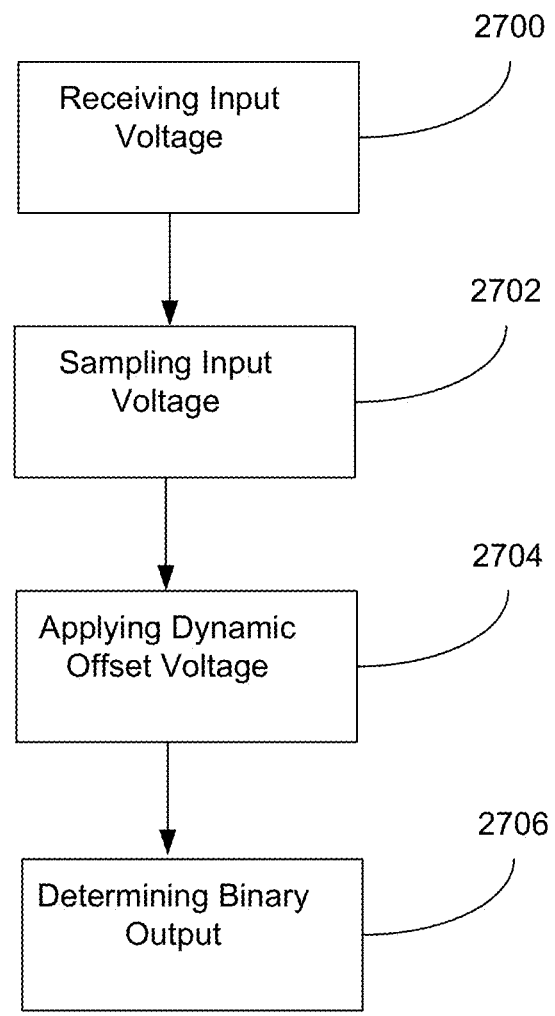
FIG. 27 illustrates a method of signal receiving according to one or more embodiments.

FIG. 27 illustrates a method for signal receiving. The method can include the following steps.

Block 2700 represents receiving an input voltage at a front-end including a resistor or transimpedance amplifier (TIA) coupled to a capacitor.

Block 2702 represents sampling the input voltage at an end of two consecutive bit times and determining a voltage difference of the sampled input voltage at the end of the two consecutive bit times, using a double sampling circuit.

Block 2704 represents applying a dynamic offset voltage to the voltage difference with an offset voltage circuit.

Block 2706 represents determining a binary output representing the signal from the voltage difference with the applied dynamic offset voltage.

Figure 28:
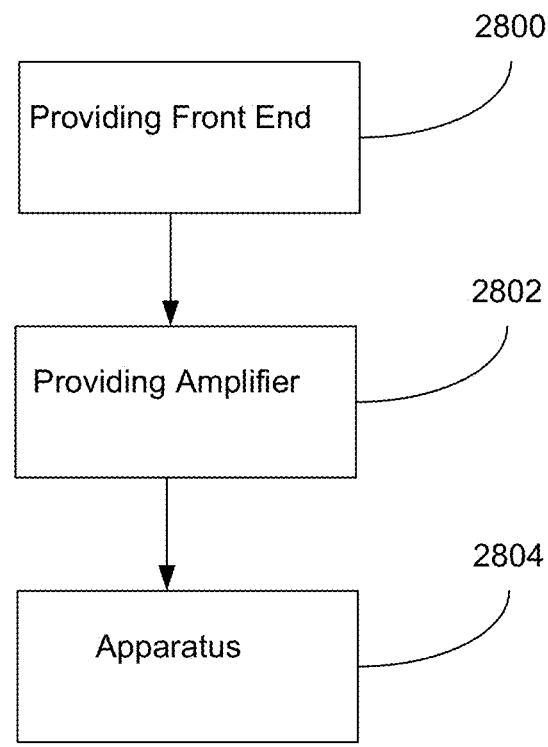
FIG. 28 illustrates a method of fabricating an apparatus, according to one or more embodiments.

FIG. 28 illustrates a method for fabricating an apparatus for signal receiving.

Block 2800 represents providing a (e.g. low bandwidth) resistive front-end for (e.g., low power high speed) signal communication including a double sampling circuit for sampling an input voltage, at the end of two consecutive bit times, producing a voltage difference used to determine a signal received on the front end; and a dynamic offset modulation (DOM) circuit for applying a dynamic offset voltage to the voltage difference, wherein the DOM circuit avoids input-dependent performance degradation. The apparatus can avoid a full bandwidth front end or the front-end can have a bandwidth that is at least an order of magnitude less than a bandwidth of the signal.

The signal can be a data bit sequence, wherein each bit in the sequence is indexed by an integer n and the input produces a signal in response thereto; the front end can include a resistor-capacitor (RC) circuit that integrates the signal to produce an exponential signal, wherein a time constant RC=τ of the RC circuit is greater than a bit time T of the data bit sequence; the double sampling circuit can sample a first level V(n−1) of the exponential signal and a next level V(n) at the bit time T later of the exponential signal, the voltage difference can be V[n]=V(n)−V(n−1), V[n]>0 can indicate the $n^{th}$ bit is a one, and V[n]<0 can indicate the $n^{th}$ bit is a zero; and a DOM circuit can convert V[n] into a V'[n] having a constant magnitude if the V[n] is different from the constant magnitude.

The constant magnitude can be $\alpha/2(1-e-T/\tau)$ and α is a gain between the double sampling circuit and the input of the sense amplifier.

The RC circuit can comprise a parasitic capacitance C and a resistance of the input, and a shunt resistor R in parallel with the resistance, and RC=τ can be given by the product of the resistance of R and a parasitic capacitance C, such that an output of the input in response to the data bit sequence is integrated over the parasitic capacitance to produce the exponential signal.

The signal can be a current detected by a photodiode having a parasitic capacitance, and the exponential voltage signal across the parasitic capacitance and applied to the double sampling circuit can be $V_{PD}=V_{DD}-RI_1 e^{-t/RC}$, where t is time, $I_1$ is the current generated by the input in response to a bit comprising a one, $V_{DD}$ is a voltage of a power rail of the receiver, R is selected to prevent out of range input voltages that would saturate the sense amplifier or comparator.

A gain of the dynamic offset voltage can be $(1-e^{-T/\tau})$, where T is a bit time τ is an RC time constant of the front end.

The input voltage can be from an on-chip interconnect, from a photodiode receiving light, and/or be a pulse amplitude modulation signal, for example.

The front-end, the double sampling circuit, and the offset voltage circuit can be implemented in complementary metal oxide semiconductor (CMOS).

The resistor can be replaced with a TIA. The front end can comprise a Resistance-Capacitance (RC) circuit and a resistance R in the RC circuit can be a low-bandwidth Trans Impedance Amplifier (TIA).

The front end can be for low power (less than 0.5 pJ/s) and high speed (higher than 20 Gb/s) signal communication. Speed and power numbers depend on fabrication technology. However, for 65 nm CMOS technology the speed can be higher that 20 Gb/s and power can be lower than 0.5 pJ/s. As the technology scales to smaller nodes these numbers get better.

Block 2802 represents providing a device (e.g., sense amplifier or comparator) to receive the V'[n] or the V[n] having the constant magnitude at its input to read each data bit in the data bit sequence. An isolation or buffer amplifier can isolate the sense amplifier from the double sampler.

Block 2804 represents the end result, an apparatus for signal communication. The apparatus can be scalable and portable. In reference to scalability, one or more embodiments of the design can be implemented in any CMOS technology node (in fact the two prototypes tested were in 65 nm CMOS and 28 nm CMOS). So as the technology advances to smaller nodes, i.e. 20 nm-14 nm etc, the proposed design is still valid.

Figures 29A, 29B:
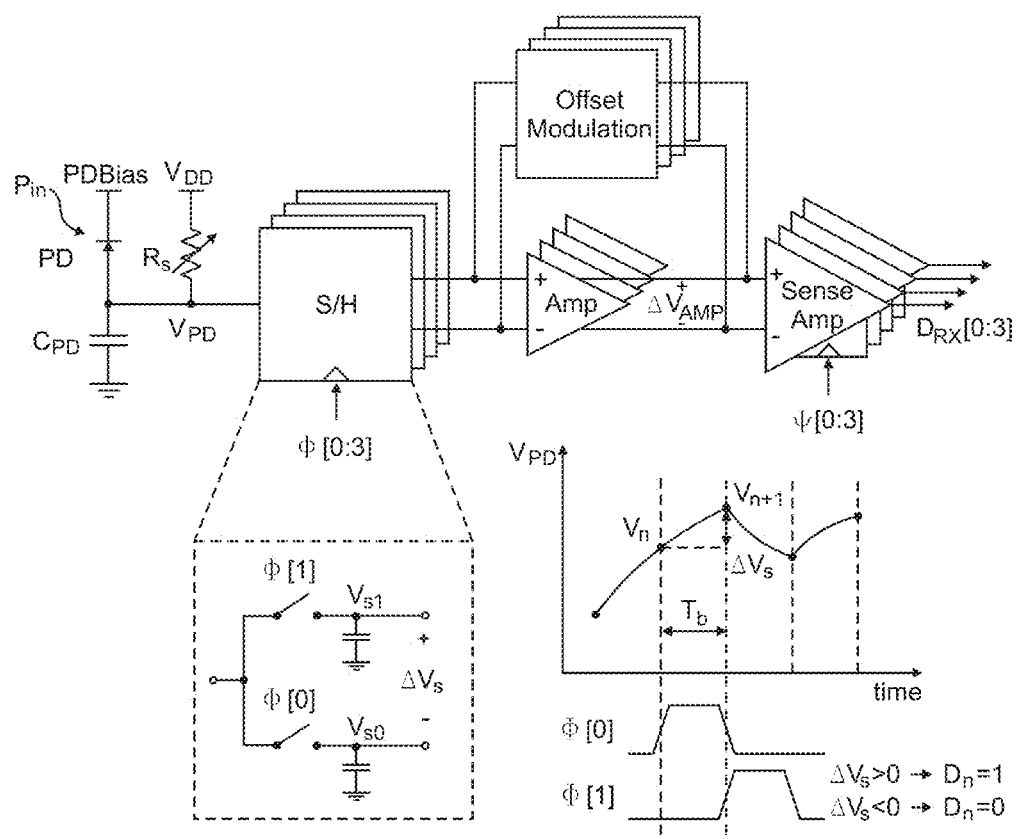
FIG. 29 illustrates an optical receiver in FIG. 29A, $V_{PD}$ as a function of time in FIG. 29B, and a DOM technique in FIG. 29C, according to one or more embodiments, wherein sampled voltage is $V_{S0}$, reference voltage $V_{REF}$ is defined as the average of the maximum ($V_{DD}-Rs \times I_{zero}$) and minimum ($V_{DD}-Rs \times I_{one}$) voltages at $V_{PD}$, as a worst case, a long sequence of ones, followed by a long sequence of zeros is considered, the first one after zeros generates a large voltage at $V_{PD}$, as the number of successive ones increases, this voltage decays exponentially due to Rs and $C_{PD}$, if the maximum voltage at the output of the amplifier ($\Delta V_{AMP}$) is equal to $\Delta V_{max}$, dynamic offset modulation introduces an offset so that the sense amplifier differential input is ΔVmax/2, regardless of the previous bits (e.g., an offset equal to −ΔVmax/2 is applied when $\Delta V_{AMP}$=ΔVmax, no offset is applied when $\Delta V_{AMP}$=ΔVmax/2, and an offset equal to ΔVmax/2 is applied if $\Delta V_{AMP}$=0)
FIG. 29D illustrates optical sensitivity.
FIG. 29E illustrates power efficiency.
FIG. 29F illustrates an input diagram.
FIG. 29G illustrates an output diagram, according to one or more embodiments of the receiver illustrated in FIG. 29A.
Figure 29C:
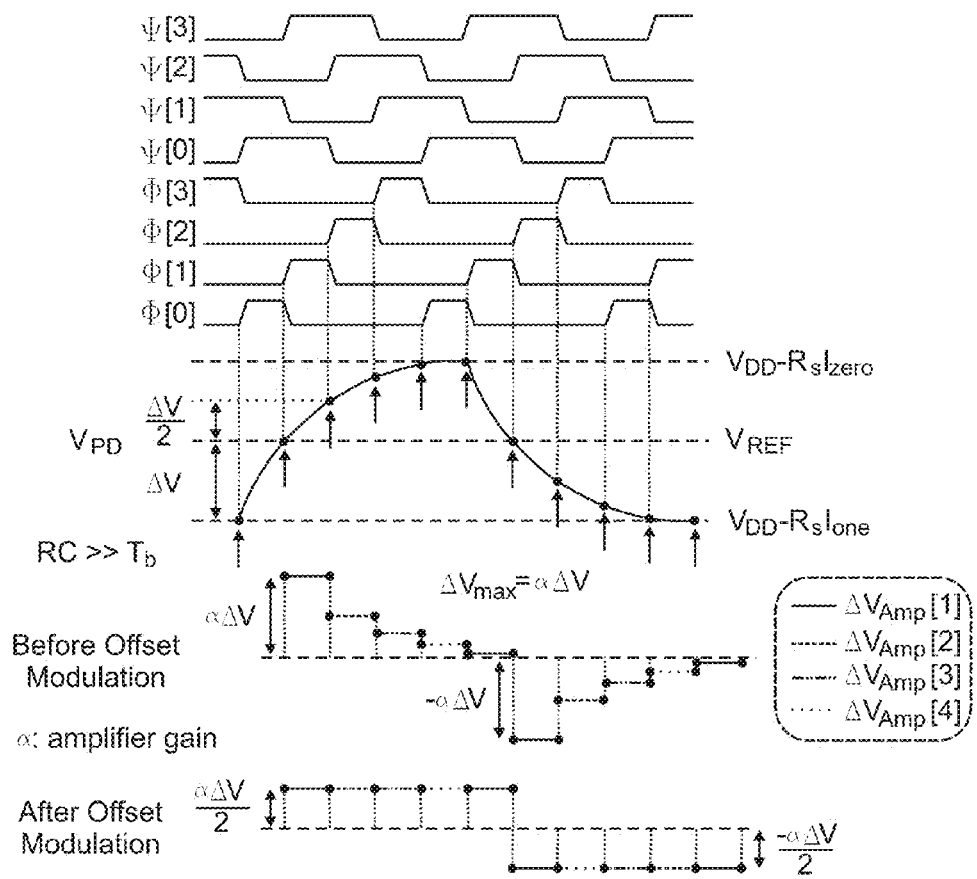
Figure 29E:
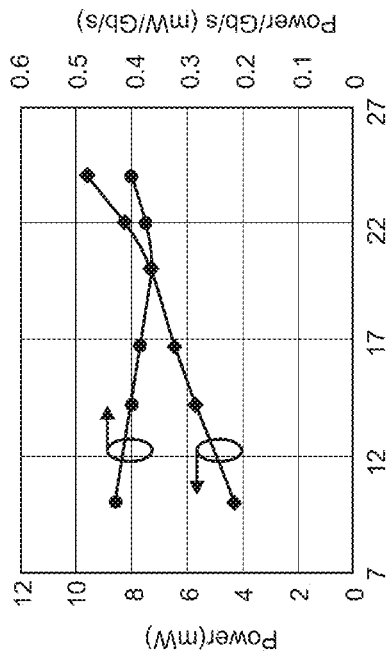
Figure 29D:
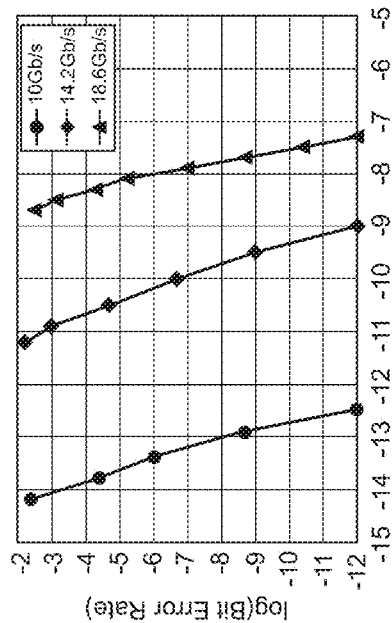
Figure 29G:
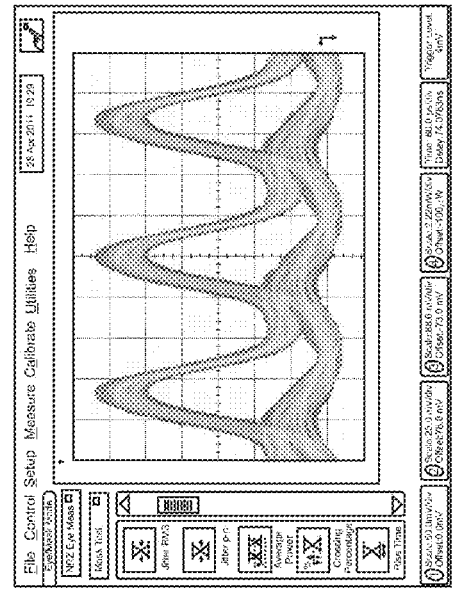
Figure 29F:
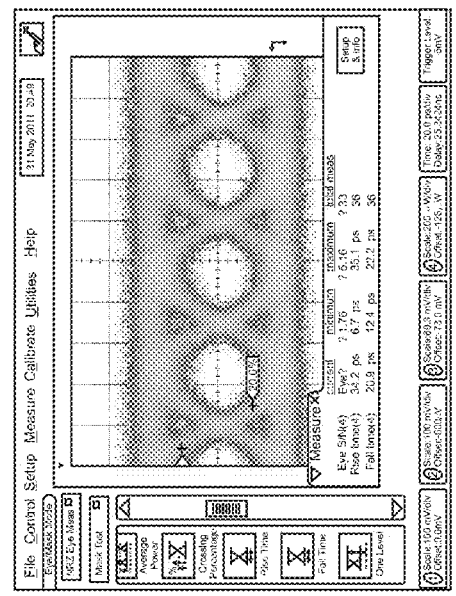

In one embodiment, the double sampling circuit can perform de-multiplexing (e.g., time division demultiplexing), as shown in the embodiment of FIG. 29C. FIGS. 29D-G show performance data of the embodiment fabricated in a 65 nm CMOS technology occupying an area of 50 microns by 50 microns or less than 0.0028 mm$^2$, using parameters as described in paragraphs 104-105, Cs chosen to be about 15 fF to optimize the trade-off between the S/H speed and KT/C noise, and an amplifier with 6 dB of gain providing isolation between the sensitive sampling node and the sense amplifier to minimize kick-back.

10. Advantages and Improvements

As the CMOS technology scales along the ITRS roadmap, there is an ever-increasing gap between core processing power and inter-chip I/O electrical channel bandwidth. Optical channels have negligible frequency dependent loss while they have orders of magnitude higher bandwidth density compared to electrical channels. This makes optical channels an attractive alternative for I/O parallel links Recent improvements in silicon photonics have established a new milestone in chip-to-chip I/O bandwidth. Low-cap high-speed photodetectors have surpassed 30 GHz of bandwidth while maintaining very low capacitance load. Besides, novel hybrid integration techniques, such as micro bump or through silicon via, provide extremely low-capacitance bonds between photo-detectors and the receiver circuitry eliminating needs for high-capacitance traditional wire-bonds or flip-chip bonds. As the total capacitive load of the photo-detector and its bonding to circuitry decreases, it becomes comparable to the load of receiver stages. This shift of paradigm necessitates rethinking of optical receiver architecture to take full advantage of the state-of-the-art technology. One or more embodiments of the invention satisfy this need.

One or more embodiments include a compact low-power optical receiver that scales well with technology for use in optical signaling in chip-to-chip and on-chip communication.

One or more embodiments achieve a dense, high speed, low power-efficient optical receiver in 65 nm CMOS that supports up to 24 Gb/s of data rate. The low-voltage RC front-end receiver uses mostly digital building blocks and avoids the use of linear high-gain analog elements. The proposed receiver employs double-sampling and dynamic offset modulation to resolve arbitrary patterns. An efficient adaptation algorithm for adjustment of DOM gain is proposed and investigated. The application of the baud-rate clock recovery to the receiver is also analyzed. The receiver consumes less than 0.36 pJ/b power at 20 Gb/s, and operates up to 24 Gb/s with −4.7 dBm optical sensitivity (BER<10$^{-12}$). Since a large percentage of power consumption is due to the clock buffers and digital blocks, the overall power consumption can greatly benefit from technology scaling. It is also shown that this design is highly suitable for hybrid integration with low-capacitance photodiodes to achieve high optical sensitivity and high data rate. Experimental results validate the feasibility of the receiver for ultra-low-power, high-data rate and highly parallel optical links.

One or more embodiments achieve a high data rate, low power on-chip link in 28 nm CMOS. This embodiment features a double-sampling receiver with dynamic offset modulation and a capacitively-driven transmitter. The functionality of one embodiment link was validated using 4-7 mm minimum-pitch on-chip wires, achieving up to 20 Gb/s of data rate (13.9 Gb/s/μm) with BER<10$^{-12}$, better than 136 fJ/b of power efficiency at 10 Gb/s, and the total area of the transmitter and receiver less than 1110 μm$^2$. In one embodiment, a transceiver for repeater-less on-chip communication demonstrates high bandwidth density, low latency, and low power consumption. The mainly digital architecture of this embodiment is well-suited for highly-scaled technologies. Experimental results for one or more embodiments validate the functionality of the link in 28 nm CMOS. One or more embodiments offer up to 20 Gb/s/ch data rate and 12.5 Gb/s/μm bandwidth density with better than 180 fJ/b energy efficiency.

REFERENCES

The following references are incorporated by reference herein.

[1] H. Sugita et al, "A 16 Gb/s 1st-Tap FFE and 3-Tap DFE in 90 nm CMOS," *IEEE ISSCC Dig. Tech. Papers*, pp. 162-163, February 2010.

[2] Y. Liu et al, "A 10 Gb/s Compact Low-Power Serial I/O with DFE-IIR Equalization in 65 nm CMOS," *IEEE ISSCC Dig. Tech. Papers*, pp. 182-183, February 2009.

[3] M. H. Nazari, A. Emami-Neyestanak, "A 15 Gb/s 0.5 mW/Gb/s 2-Tap DFE Receiver with Far-End Crosstalk Cancellation," *IEEE ISSCC Dig. Tech. Papers*, pp., February 2011.

[4] C. L. Schow, et al, "Low-Power 16×10 Gb/s Bi-Directional Single Chip CMOS Optical Transceivers Operating at <5 mW/Gb/s/link," *IEEE Journal of Solid-State Circuits*, vol. 44, no. 1, pp. 301-313, January 2009.

[5] C. Kromer et al, "A 100-mW 4×10 Gb/s Transceiver in 80-nm CMOS for High-Density Optical Interconnects," *IEEE Journal of Solid-State Circuits*, vol. 40, no. 12, pp. 2667-2679, December 2005.

[6] T. Takemoto et al, "A Compact 4×25-Gb/s 3.0 mW/Gb/s CMOS-Based Optical Receiver for Board-to-Board Interconnects," *IEEE J. of Lightwave Tech.*, vol. 28, no. 23, pp. 3343-3350, December 2010.

[7] I. A. Young, et al, "Optical I/O Technology for Tera-Scale Computing," *IEEE Journal of Solid-State Circuits*, vol. 45, no. 1, pp. 235-248, January 2010.

[8] F. Liu, et al, "10 Gbps, 530 fJ/b optical transceiver circuits in 40 nm CMOS," *IEEE Symp. on VLSI circuits Dig. Tech. Papers*, pp. 290-291, June 2011.

[9] S. Palermo et al, "A 90 nm CMOS 16 Gb/s Transceiver for Optical Interconnect," *IEEE Journal of Solid-State Circuits*, vol. 43, no. 5, pp. 1235-1246, May 2008.

[10] D. Kucharski et al, "10 Gb/s 15 mW Optical Receiver with Integrated Germanium Photodetector and Hybrid Inductor Peaking in 0.13 µm SOI CMOS Technology," *IEEE ISSCC Dig. Tech. Papers*, pp. 360-361, February 2010.

[11] A. Narasimha et al, "A Fully Integrated 4×10-Gb/s DWDM Optoelectronic Transceiver Implemented in a Standard 0.13 µm CMOS SOI Technology," *IEEE JSSC*, vol. 42, no. 12, pp. 2736-2744, December 2007.

[12] J. Montanaro et al, "A 160-MHz, 32-b, 0.5-W CMOS RISC microprocessor," *IEEE Journal of Solid-State Circuits*, vol. 31, no. 11, pp. 1703-1714, November 1996.

[13] M. H. Nazari et al, "An 18.6 Gb/s Double-Sampling Receiver in 65 nm CMOS for Ultra Low-power Optical Communication," *IEEE ISSCC Dig. Tech. Papers*, pp., February 2012.

[14] M. E. Lee et al, "Low-Power Area-Efficient High-Speed I/O Circuit Techniques," *IEEE Journal of Solid-State Circuits*, vol. 35, no. 11, November 2000.

[15] A. Emami-Neyestanak et al., "A 1.6 Gb/s, 3 mW CMOS receiver for optical communication," in *IEEE Symp. VLSI Circuits Dig.*, pp. 84-87, June 2002.

[16] M. J. M. Pelgrom et al, "Matching properties of MOS transistors," *IEEE Journal of Solid-State Circuits*, vol. 24, no. 5, pp. 1433-1439, October 1989.

[17] S. Sidiropoulos et al, "A Semidigital Dual Delay-Locked Loop," *IEEE Journal of Solid-State Circuits*, vol. 32, no. 11, pp. 1683-1692, November 1997.

[18] J. D. H. Alexander, "Clock recovery from random binary signals," *IEEE Electronics Letters*, vol. 11, pp. 541-542, 1975.

[19] A. Emami-Neyestanak et al., "CMOS transceiver with baud-rate clock recovery for optical interconnects," in *IEEE Symp. VLSI Circuits Dig.*, pp. 410-413, June 2004.

[20] M. H. Nazari et al, "Ultra Low-Power Receiver Design for Dense Optical Interconnects," *IEEE Optical Interconnects Conf.*, May 2012.

[21] M. Georgas et al, "A Monolithically-Integrated Optical Receiver in Standard 45-nm SOI," *IEEE Journal of Solid-State Circuits*, vol. 47, no. 7, pp. 1693-1702, July 2012.

[22] International Technology Roadmap for Semiconductors (ITRS) 2011 Update. Semiconductor Industry Association (SIA), 2011.

[23] H. Ito et al., "A Low-Latency and High-Power-Efficient On-Chip LVDS Transmission Line Interconnect for an RC Interconnect Alternative," IEEE Int. Interconnect Tech. Conf., pp. 193-195, 2007.

[24] J. Seo et al., "High-Bandwidth and Low-Energy On-Chip Signaling with Adaptive Pre-Emphasis in 90 nm CMOS," IEEE ISSCC Digest of Technical Papers, pp. 182-183, February 2010.

[25] R. Ho et al., "High Speed and Low Energy Capacitively Driven On-Chip Wires," IEEE J. Solid-State Circuits, vol. 43, No. 1, pp. 52-60, 2008.

[26] D. Walter et al., "A Source-Synchronous 90 Gb/s Capacitively Driven Serial On-Chip Link Over 6 mm in 65 nm CMOS," IEEE ISSCC Digest of Technical Papers, pp. 180-181, February 2012.

[27] E. Mensink et al., "Power Efficient Gigabit Communication over Capacitively Driven RC-Limited On-Chip Interconnects," IEEE J. Solid-State Circuits, vol. 45, No. 2, pp. 447-457, 2010.

[28] A. P. Jose et al., "Distributed Loss-Compensation Techniques for Energy-Efficient Low-Latency On-Chip Communication," IEEE J. Solid-State Circuits, vol. 42, No. 6, pp. 1415-1424, 2007.

[29] B. Kim et al., "A 4 Gb/s/ch 356 fJ/b 10 mm Equalized On-Chip Interconnect with Nonlinear Charge-Injecting Transmit Filter and Transimpedance Receiver in 90 nm CMOS," IEEE ISSCC Digest of Technical Papers, pp. 66-67, February 2009.

[30] Y. Liu et. al., "A 10-Gb/s compact low-power serial I/O with DFE-IIR equalization in 65-nm CMOS," IEEE ISSCC Digest of Technical Papers, pp. 182-183, February 2009.

[31] H. G. Rhew et al., "A 22 Gb/s, 10 mm On-Chip Serial Link over Lossy Transmission Line with Resistive Termination," in Proc. Eur. Solid-State Circuits Conf., pp. 233-236, 2012.

[32] M. H. Nazari et al., "An 18 Gb/s Double-Sampling Receiver in 65 nm CMOS for Ultra-Low-Power Optical Communication," IEEE ISSCC Digest of Technical Papers, pp. 130-131, February 2012.

[33] Kucharski, D., et al. "10 Gb/s 15 mW optical receiver with integrated Germanium photodetector and hybrid inductor peaking in 0.13 µm SOI CMOS Technology." *Solid-State Circuits Conference Digest of Technical Papers (ISSCC), 2010 IEEE International.* IEEE, 2010.

[34] Li, Guoliang, et al. "Ultralow-power silicon photonic interconnect for high-performance computing systems." *Optoelectronic Interconnects and Component Integration IX* 7607 760703 (2010): 1-7.

[35] Liu, Frankie, et al. "10 Gbps, 530 fJ/b optical transceiver circuits in 40 nm CMOS." *VLSI Circuits (VLSIC), 2011 Symposium on.* IEEE, 2011.

[36] Georgas, Michael, et al. "A monolithically-integrated optical receiver in standard 45-nm SOI." *Solid-State Circuits, IEEE Journal of* 47.7 (2012): 1693-1702.

[37] Nazari, Meisam Honarvar, and Azita Emami-Neyestanak. "A 24-Gb/s Double-Sampling Receiver for Ultra-Low-Power Optical Communication." (2013): 1-14.

[38] Jonathan Proesel, Alexander Rylyakov, Clint Schow "Optical Receivers using DFE_IIR Equalization" *Solid-State Circuits Conference Digest of Technical Papers (ISSCC), 2013 IEEE International.* IEEE, 2013.

[39] "24-Gb/s Double-Sampling Receiver for Ultra-Low-Power Optical Communication", by Meisam Nazari et. al, IEEE Journal of Solid State Circuits, Vol. 48, No. 2 Feb. 2013.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:
1. An apparatus for signal receiving, comprising:
a front-end for signal communication including:
a double sampling circuit for sampling an input voltage, at the end of two consecutive bit times, producing a voltage difference used to determine a signal received on the front end; and
a dynamic offset modulation (DOM) circuit for applying a dynamic offset voltage to the voltage difference, wherein the DOM circuit avoids input-dependent performance degradation and the front-end has a bandwidth that is at least an order of magnitude less than a bandwidth of the signal.

2. The apparatus of claim 1, wherein a binary output representing the signal is determined from the voltage difference with the applied dynamic offset voltage.

3. The apparatus of claim 1, wherein a gain of the dynamic offset voltage is $(1-e^{-T/\tau})$ where T is a bit time and $\tau$ is an RC time constant of the front-end.

4. The apparatus of claim 1, wherein the input voltage is from an on-chip interconnect.

5. The apparatus of claim 1, wherein the input voltage is from a photodiode receiving light.

6. The apparatus of claim 1, wherein the input voltage is a pulse amplitude modulation signal.

7. The apparatus of claim 1, wherein the front-end, the double sampling circuit, and the offset voltage circuit are implemented in complementary metal oxide semiconductor (CMOS).

8. The apparatus of claim 1, wherein the front-end comprises an RC circuit and a resistance R in the RC circuit is a low-bandwidth Trans Impedance Amplifier (TIA).

9. The apparatus of claim 8, wherein the TIA's bandwidth is less than 10% of the operating data rate $1/T_b$.

10. The apparatus of claim 1, wherein the front-end is for low power (less than 0.5 pJ/s) and high speed (higher than 20 Gb/s) signal communication.

11. The apparatus of claim 1, wherein the apparatus is scalable and portable.

12. The apparatus of claim 1, wherein the double sampling circuit performs de-multiplexing.

13. The apparatus of claim 1, wherein:
the signal is data bit sequence, wherein each bit in the sequence is indexed by an integer n and the front-end's input produces a front-end signal in response thereto;
the front-end includes a resistor-capacitor (RC) circuit that integrates the front-end signal to produce an exponential signal, wherein a time constant RC=$\tau$ of the RC circuit is greater than a bit time T of the data bit sequence;
the double sampling circuit samples a first level V(n−1) of the exponential signal and a next level V(n) at the bit time T later of the exponential signal,
the voltage difference V[n]=V(n)−V(n−1), V[n]>0 indicates the $n^{th}$ bit is a one, and V[n]<0 indicates the $n^{th}$ bit is a zero;
the DOM circuit converts V[n] into a V'[n] having a constant magnitude if the V[n] is different from the constant magnitude;
a sense amplifier or comparator receives the V'[n] or the V[n] having the constant magnitude at its input to read each data bit in the data bit sequence; and
an isolation or buffer amplifier isolates the sense amplifier from the double sampling circuit.

14. The apparatus of claim 13, wherein the constant magnitude is $\alpha/2(1-e^{-T/\tau})$ and $\alpha$ is a gain between the double sampling circuit and the input of the sense amplifier.

15. The apparatus of claim 13, wherein:
the RC circuit comprises a parasitic capacitance C and a resistance of the front-end's input, and a shunt resistor R in parallel with the resistance, and
RC=$\tau$ is given by the product of the resistance of R and the parasitic capacitance C, such that an output of the front-end's input in response to the data bit sequence is integrated over the parasitic capacitance to produce the exponential signal.

16. The apparatus of claim 15, wherein:
the signal is a current detected by a photodiode having the parasitic capacitance, and
the exponential voltage signal across the parasitic capacitance and applied to the double sampling circuit is $V_{PD}=V_{DD}-RI_1 e^{-t/RC}$, where t is time, $I_1$ is the current generated by the front-end's input in response to a bit comprising a one, $V_{DD}$ is a voltage of a power rail of the front-end, and R is selected to prevent out of range input voltages that would saturate the sense amplifier or comparator.

17. A method for signal receiving, comprising:
receiving an input voltage at a front-end including a transimpedance amplifier (TIA) coupled to a capacitor;
sampling the input voltage at an end of two consecutive bit times and determining a voltage difference of the sampled input voltage at the end of the two consecutive bit times, using a double sampling circuit; and
applying a dynamic offset voltage to the voltage difference with an offset voltage circuit.

18. The method of claim 17, wherein a binary output representing the signal is determined from the voltage difference with the applied dynamic offset voltage.

19. The apparatus of claim 17, wherein a gain of the dynamic offset voltage is $(1-e^{-T/\tau})$ where T is a bit time and $\tau$ is an RC time constant of the front end.

20. The method of claim 17, wherein the input voltage is from an on-chip interconnect.

21. The method of claim 17, wherein the input voltage is from a photodiode receiving light.

22. The method of claim 17, wherein the input voltage is a pulse amplitude modulation signal.

23. The method of claim 17, wherein a front-end, the double sampling circuit, and the offset voltage circuit are implemented in complementary metal oxide semiconductor (CMOS).

24. The method of claim 17, wherein the TIA's bandwidth is less than 10% of the operating data rate $1/T_b$.

* * * * *